United States Patent
Ogura et al.

(10) Patent No.: US 9,362,483 B2
(45) Date of Patent: *Jun. 7, 2016

(54) VIBRATOR ELEMENT HAVING A SUPPRESSED VIBRATION SIGNAL OF LEAKAGE VIBRATION

(71) Applicant: Seiko Epson Corporation, Tokyo (JP)

(72) Inventors: Seiichiro Ogura, Minowa (JP); Takayuki Kikuchi, Okaya (JP)

(73) Assignee: Seiko Epson Corporation (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/687,401

(22) Filed: Apr. 15, 2015

(65) Prior Publication Data

US 2015/0222244 A1 Aug. 6, 2015

Related U.S. Application Data

(63) Continuation of application No. 13/298,855, filed on Nov. 17, 2011, now Pat. No. 9,030,082.

(30) Foreign Application Priority Data

Nov. 24, 2010 (JP) ................................. 2010-260937

(51) Int. Cl.
| | |
|---|---|
| *G01C 19/56* | (2012.01) |
| *H01L 41/253* | (2013.01) |
| *G01C 19/5607* | (2012.01) |
| *H01L 41/09* | (2006.01) |
| *H01L 41/047* | (2006.01) |
| *H01L 41/107* | (2006.01) |
| *H03H 9/21* | (2006.01) |

(52) U.S. Cl.
CPC .......... *H01L 41/253* (2013.01); *G01C 19/5607* (2013.01); *H01L 41/0475* (2013.01); *H01L 41/09* (2013.01); *H01L 41/107* (2013.01); *H03H 9/21* (2013.01); *Y10T 29/42* (2015.01)

(58) Field of Classification Search
CPC .................................................. G01C 19/5607
USPC ...................................... 310/370; 73/504.16
See application file for complete search history.

(56) References Cited

U.S. PATENT DOCUMENTS

| | | | |
|---|---|---|---|
| 4,930,351 A | 6/1990 | Macy et al. | |
| 5,251,483 A | 10/1993 | Soderkvist | |

(Continued)

FOREIGN PATENT DOCUMENTS

| | | |
|---|---|---|
| CN | 101173957 A | 5/2008 |
| CN | 101676729 A | 3/2010 |

(Continued)

*Primary Examiner* — J. San Martin
(74) *Attorney, Agent, or Firm* — Harness, Dickey & Pierce, P.L.C.

(57) ABSTRACT

A vibration gyro device has a base part and a pair of drive vibrating arms and a pair of detection vibrating arms respectively extended from both ends in a Y-axis direction of the base part. Further, adjustment vibrating arms extended from respective ends of connecting parts respectively extended from both ends in an X-axis direction of the base part in parallel to the drive vibrating arms are provided. At the end sides of the respective adjustment vibrating arms, spindle parts as wider parts are provided. On principal surfaces of the respective adjustment vibrating arms, adjustment electrodes as membranes for adjustment of leakage output of the vibration gyro device are provided.

7 Claims, 12 Drawing Sheets

(56) References Cited

U.S. PATENT DOCUMENTS

| | | | |
|---|---|---|---|
| 5,522,249 A | 6/1996 | Macy | |
| 5,585,562 A | 12/1996 | Kurata et al. | |
| 5,635,642 A | 6/1997 | Nonomura et al. | |
| 6,119,519 A | 9/2000 | Konno et al. | |
| 6,253,613 B1 | 7/2001 | Yachi et al. | |
| 6,327,908 B1 | 12/2001 | Yachi et al. | |
| 6,666,091 B2 | 12/2003 | Hatanaka et al. | |
| 7,207,221 B2 | 4/2007 | Kawauchi et al. | |
| 7,975,545 B2 | 7/2011 | Noguchi et al. | |
| 9,030,082 B2 * | 5/2015 | Ogura | G01C 19/5607 310/344 |
| 2004/0177690 A1 | 9/2004 | Kato | |
| 2008/0105052 A1 | 5/2008 | Takahashi et al. | |
| 2010/0064806 A1 | 3/2010 | Inaguma | |
| 2010/0164328 A1 | 7/2010 | Iwai | |
| 2012/0126664 A1 | 5/2012 | Ogura et al. | |

FOREIGN PATENT DOCUMENTS

| | | | |
|---|---|---|---|
| JP | 62217115 | | 9/1987 |
| JP | 05-256723 | A | 10/1993 |
| JP | 08-327366 | A | 12/1996 |
| JP | 09-178491 | A | 7/1997 |
| JP | 10-019575 | | 1/1998 |
| JP | 10-078326 | | 3/1998 |
| JP | 11-063999 | | 3/1999 |
| JP | 2004-279101 | A | 10/2004 |
| JP | 2006-054602 | A | 2/2006 |
| JP | 2006-189353 | A | 7/2006 |
| JP | 2008-14887 | A | 1/2008 |
| JP | 2008096138 | A * | 4/2008 |
| JP | 2008-157856 | A | 7/2008 |
| JP | 2008-209215 | A | 9/2008 |
| JP | 2008-224627 | A | 9/2008 |
| JP | 2010-135898 | A | 6/2010 |
| JP | 2012-112748 | A | 6/2012 |

* cited by examiner

VIBRATOR ELEMENT HAVING A SUPPRESSED VIBRATION SIGNAL OF LEAKAGE VIBRATION

CROSS-REFERENCE TO RELATED APPLICATIONS

This is a continuation patent application of U.S. application Ser. No. 13/298,855 filed Nov. 17, 2011, which claims priority to Japanese Patent Application No. 2010-260937, filed Nov. 24, 2010 both of which are expressly incorporated by reference herein in their entireties.

BACKGROUND

1. Technical Field

The present invention relates to a vibrator element, a sensor unit using the vibrator element, an electronic apparatus including the vibrator element and the sensor unit, and manufacturing methods of the vibrator element and the sensor unit.

2. Related Art

Vibration gyro sensors (hereinafter, referred to as "vibration gyros") have been widely used as angular velocity sensors that enhance body control in vehicles and position detection of car navigation systems, and vibration control and compensation functions (so-called "camera shake compensation"), or the like for digital cameras, digital video cameras, etc. The vibration gyro obtains displacement of an object using a gyro vibrator element of a piezoelectric single-crystal material such as quartz crystal as a highly elastic material by detecting an electric signal generated due to vibration of shaking, rotating, or the like of the object in a part of the gyro vibrator element as an angular velocity and computing a rotation angle.

As vibrator elements used for gyro sensors, piezoelectric vibrator elements (vibration gyro devices) formed using a piezoelectric material such as quartz crystal have been widely used in related art (for example, see Patent Document 1 (JP-A-5-256723)). The vibrator element disclosed in Patent Document 1 is the so-called "tuning-fork piezoelectric vibrator element" including a base part made of quartz crystal and a pair of vibrating arms extended in parallel from one end of the base part. A drive electrode (excitation electrode) that supplies a drive voltage for excitation of the vibrating arm is provided on a principal surface (first surface) of each vibrating arm and a detection electrode is provided on a side surface orthogonal to the first surface. Further, by applying a drive signal (excitation signal) to the drive electrode, the vibrating arm may be vibrated. Here, while the drive signal is applied to the vibrator element for vibration of the vibrating arm in a direction along the first surface (in-plane vibration), when the arm is rotated with the axis in the extension direction of the vibrating arm (for example, the Y-axis in the case of the vibration gyro device including a quartz crystal Z-plate as a base material) as a detection axis, the vibrating arm vibrates in a direction orthogonal to the first surface (out-of-plane vibration) due to Coriolis force. The amplitude of the out-of-plane vibration may be detected as an angular velocity because it is proportional to the rotation velocity of the vibrator element.

The base part and the vibrating arms of the above described vibration gyro device may be integrally formed by etching of quartz crystal using photolithography, for example. Originally, the sectional shape of the vibrating arm is designed to be a rectangular shape, however, it does not become a rectangular shape, but a parallelogram shape, rhombic shape, or more complex indefinite shape due to etching anisotropy of quartz crystal, variations in working process, or the like. In this regard, when the sectional shape of the vibrating arm is deformed from the originally designed rectangular shape, the vibration direction of the vibrating arm shifts from a designed value, and undesired vibration leakage of the so-called "leakage output" occurs and causes deterioration of detection sensitivity of the vibration gyro device. As a method of suppressing the leakage output, a vibration gyro device provided with cut parts near the roots of the vibrating arms to the base part is introduced in Patent Document 2 (JP-A-2008-209215), for example.

The vibration gyro device (angular velocity sensor device) of Patent Document 2 has a base part and a vibrating arm extended from the base part, and a drive electrode that excites vibration in the width direction of the vibrating arm and a detection electrode that detects electric charge due to vertical vibration in the thickness direction of the vibrating arm are provided on the vibrating arm. Further, plural cut parts formed by laser processing are provided near the root of the vibrating arm to the base part at least on one end in the width direction of the vibrating arm. The document describes that the leakage output (oblique vibration) may be suppressed by changing the mass distribution using the cut parts provided near the root of the vibrating arm to the base part.

However, in the vibration gyro device disclosed in Patent Document 2, it is necessary to provide extremely microscopic cut parts for fine adjustment for suppression of leakage output. Recently, there have been problems that it is getting more difficult to form cut parts with downsizing of the vibration gyro device (vibrator element) and the mechanical strength of the vibration gyro device becomes weaker due to the formation of the cut parts.

SUMMARY

An advantage of some aspects of the invention is to solve at least a part of the problems described above and the invention can be realized as the following forms or application examples.

Application Example 1

This application example is directed to a vibrator element including a base part, a first vibrating arm and a second vibrating arm extended from the base part, and an adjustment part provided on the second vibrating arm, wherein an output signal of the second vibrating arm is at an opposite phase to that of an output signal of leakage vibration of the first vibrating arm.

According to the configuration, the inventors have found that the leakage output of the vibration of the first vibrating arm may be cancelled out and suppressed by removing or adding a part of the adjustment part of the second vibrating arm. Thereby, compared to the method in related art of performing suppression adjustment of the leakage output by processing a part of the outer shape of the vibrator element, the configuration is advantageous for downsizing and fine adjustment may be made, and a vibrator element having the smaller size, the higher mechanical strength, and the higher sensitivity characteristics may be provided.

Application Example 2

This application example is directed to the vibrator element according to the above application example, wherein a drive electrode to which a drive voltage is applied and a detection electrode that electrically detects vibration generated in response to a physical quantity applied at driving of the first vibrating arm are provided on the first vibrating arm.

According to the configuration, when a physical quantity such as an angular velocity or acceleration is applied to the vibrator element, the physical quantity may be detected using the detection electrode, and a sensor having the smaller size and the higher sensitivity characteristics may be realized using the vibrator element of the embodiment.

Application Example 3

This application example is directed to the vibrator element according to the above application example, wherein a metal film is provided in the adjustment part, and the metal film and the detection electrode are electrically connected.

According to the configuration, the charge (current) of the second vibrating arm is controlled by removing a part of the metal film provided in the adjustment part of the second vibrating arm by laser application, for example, or adding a metal film by evaporation or sputtering, and thereby, finer suppression adjustment of leakage output may be performed.

Application Example 4

This application example is directed to the vibrator element according to the above application example, wherein the base part, the first vibrating arm, and the second vibrating arm are formed using a piezoelectric material, and the second vibrating arm is extended in a direction intersecting a polarization axis of the piezoelectric material.

As described above, the vibrator element is formed using the piezoelectric material, and thereby, driving of the vibrating arms and detection of output voltages may be easily performed using the piezoelectric phenomenon of the piezoelectric material.

Application Example 5

This application example is directed to the vibrator element according to the above application example, wherein the first vibrating arm includes a drive vibrating arm extended from one end of the base part and a detection vibrating arm extended from other end of the base part.

In the vibrator element having the configuration, the vibrating arm of the drive system and the vibrating arm of the detection system are separated, and electrostatic coupling between electrodes or wires of the vibrating arm of the drive system and the vibrating arm of the detection system is reduced and detection sensitivity becomes stable.

Application Example 6

This application example is directed to the vibrator element according to the above application example, wherein the second vibrating arm is extended to the detection vibrating arm side.

As described above, the adjustment vibrating arm having the adjustment electrode electrically connected to the detection electrode provided on the detection vibrating arm and the drive vibrating arm on which the drive electrode is provided are not adjacently but separately placed, and therefore, deterioration of detection sensitivity that may be caused due to coupling of the drive signal and the detection signal may be suppressed.

Application Example 7

This application example is directed to the vibrator element according to the above application example, wherein a wider part in which the adjustment part is provided on an end of the second vibrating arm is provided.

According to the configuration, the suppression effect of leakage vibration may be improved while increase in the length of the second vibrating arm is suppressed and the adjustment range for suppression of the leakage vibration may be taken wider, and therefore, the vibrator element having the smaller size and the higher sensitivity characteristics may be provided.

Application Example 8

This application example is directed to the vibrator element according to the above application example, wherein a length of the second vibrating arm is shorter than a length of the first vibrating arm.

According to the configuration, the vibration of the second vibrating arm for adjustment of the leakage output does not hinder the main vibration of the vibrator element by the first vibrating arm (drive vibrating arm and detection vibrating arm), and therefore, the vibration characteristics of the vibrator element become stable and the configuration is advantageous for downsizing of the vibrator element.

Application Example 9

This application example is directed to a sensor unit including the vibrator element according to the above described application example, an electronic component including a drive circuit that excites the first vibrating arm and a detection circuit that detects a detection signal generated in the first vibrating arm, and a package that contains the vibrator element and the electronic component.

According to the configuration, as the sensor unit, a sensor unit including the vibrator element that exerts the effect according to any one example of the application examples may be provided.

In addition, the sensor unit having the package type configuration has advantages for downsizing and thinning and the higher resistance to impact.

Application Example 10

This application example is directed to an electronic apparatus including the vibrator element according to any one of the application examples.

According to the configuration, the high-sensitivity vibrator element for which suppression of the leakage output according to any one of the application examples is adjusted is provided, and therefore, an electronic apparatus having high functions and stable characteristics may be provided.

Application Example 11

This application example is directed to a manufacturing method of a vibrator element including forming a base part and a first vibrating arm and a second vibrating arm extended from the base part, forming an adjustment part on the second vibrating arm, measuring an output signal of leakage vibration of the first vibrating arm, and adjusting an output signal of the second vibrating arm at an opposite phase to that of the output signal of leakage vibration by removing or adding a part of the adjustment part of the second vibrating arm.

According to the configuration, the inventors have found that the leakage output of the detected vibration of the first vibrating arm may be cancelled out and suppressed by removing or adding a part of the adjustment part of the second vibrating arm. Thereby, compared to the method in related art of performing suppression adjustment of the leakage output by processing a part of the outer shape of the vibrator element, the configuration is advantageous for downsizing and fine adjustment may be made, and a vibrator element having the smaller size and the higher sensitivity may be provided.

Application Example 12

This application example is directed to the manufacturing method of a vibrator element according to the above application example, which further includes adjusting a frequency of the second vibrating arm.

According to the configuration, given that the resonance frequency of the drive vibrating arm is $f_d$ and the resonance frequency of the adjustment vibrating arm is $f_t$, the magnitude relationship between $f_d$ and $f_t$ may be appropriately set before correction of the leakage output, and therefore, the leakage output may be corrected with efficiency and the high-sensitivity vibrator element may be manufactured.

Application Example 13

This application example is directed to a manufacturing method of a sensor unit including forming a base part and a first vibrating arm and a second vibrating arm extended from the base part, forming an adjustment electrode on the second vibrating arm, connecting the adjustment electrode and a detection circuit including a circuit element, outputting a differential signal between an output signal of leakage vibration of the first vibrating arm and an output signal of the second vibrating arm, and correcting the differential signal by changing a constant of the circuit element.

According to the configuration, by adjusting the circuit constant of the circuit element of the detection circuit, the adjustment of suppressing the leakage output lower may be performed. Therefore, the step of trimming a part of the membrane using laser or the like or adding a membrane by sputtering or evaporation is not necessary, and the sensor unit with high sensitivity in which the leakage output is suppressed in the relatively simple process may be manufactured.

BRIEF DESCRIPTION OF THE DRAWINGS

The invention will be described with reference to the accompanying drawings, wherein like numbers reference like elements.

FIG. 12A is a perspective view of a digital video camera, FIG. 12B is a perspective view of a cellular phone, and FIG. 12C is a perspective view of a personal digital assistant (PDA).

DESCRIPTION OF EXEMPLARY EMBODIMENTS

As below, one embodiment of a vibrator element of the invention and a sensor unit including the reed will be explained with reference to the drawings.

First Embodiment

Vibration Gyro Device

Figure 1:
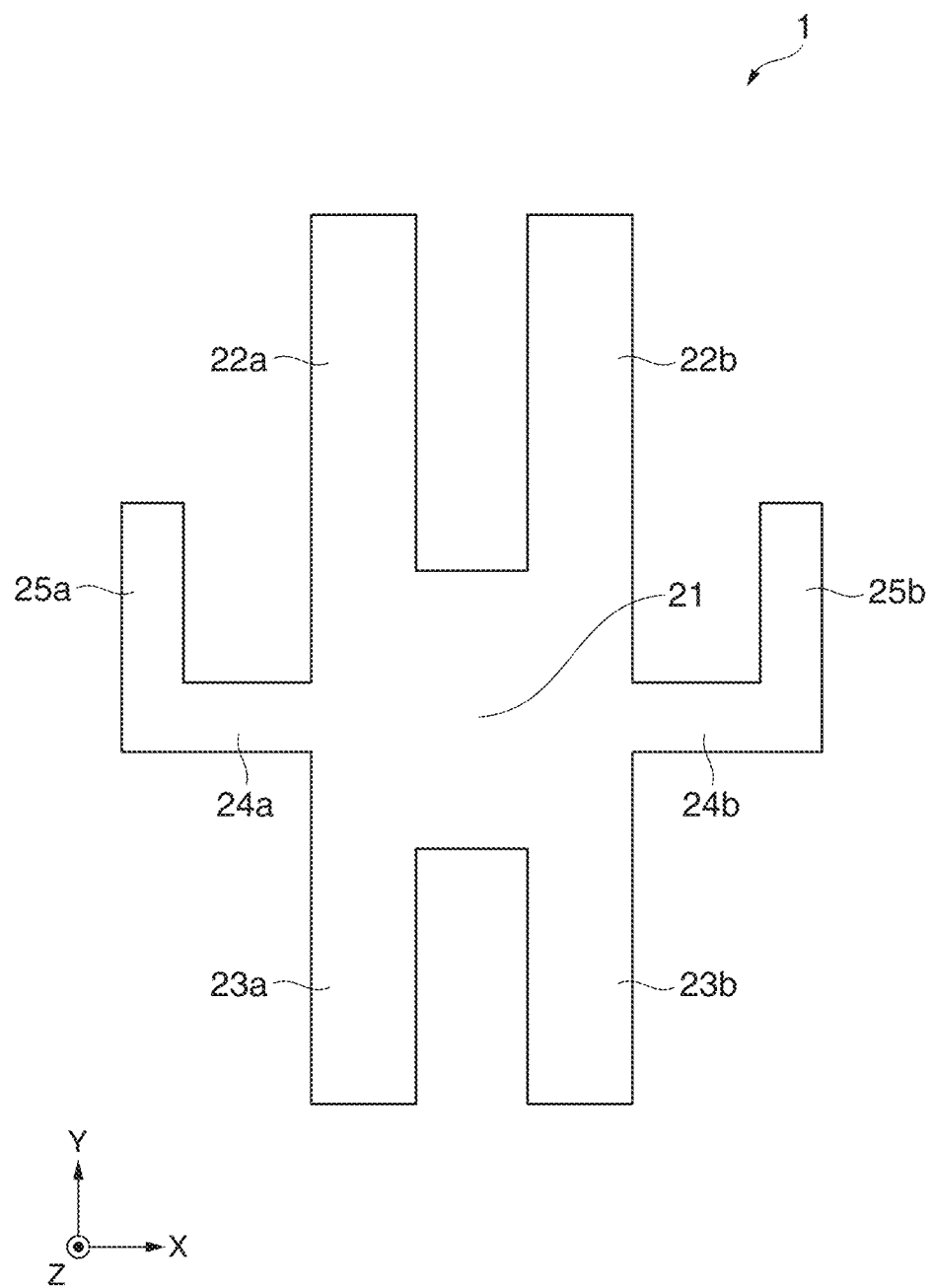
FIG. 1 is a schematic plan view showing a vibration gyro device as a vibrator element.

First, an embodiment in which a vibrator element of the invention is embodied as a vibration gyro device will be explained. FIG. 1 is a schematic plan view showing one embodiment of a vibration gyro device as a vibrator element.

As shown in FIG. 1, the vibration gyro device 1 as a vibrator element has a base part 21 integrally formed by processing a base material (a material forming a main part), drive vibrating arms 22a, 22b and detection vibrating arms 23a, 23b as first vibrating arms and adjustment vibrating arms 25a, 25b as second vibrating arms.

As the vibration gyro device 1 of the embodiment, an example using quartz crystal as a piezoelectric material as the base material will be explained. The quartz crystal has X-axis called "electrical axis", Y-axis called "mechanical axis", and Z-axis called "optical axis". In the embodiment, the example using the so-called quartz crystal Z-plate as a base material cut out along a plane defined by the X-axis and the Y-axis orthogonal to each other in the crystal axes of crystal quartz and processed into a flat plate and having a predetermined thickness in the Z-axis direction orthogonal to the plane will be explained. Note that the predetermined thickness here is appropriately set according to an oscillation frequency (resonance frequency), outer size, workability, or the like.

Further, the flat plate forming the vibration gyro device 1 may allow errors of cutout angles from quartz crystal in some margins with respect to the X-axis, the Y-axis, and the Z-axis. For example, the plate rotated in a range from 0 to 2 degrees around the X-axis and cut out may be used. The same is applicable with respect to the Y-axis and the Z-axis.

The vibration gyro device 1 has the base part 21 located in the center part and having a nearly rectangular shape, the drive vibrating arms 22a, 22b as a pair of the first vibrating arms extended from one end of ends in the Y-axis direction (+Y direction in the drawing) of the base part 21 in parallel along the Y-axis and the detection vibrating arms 23a, 23b as a pair of the first vibrating arms extended from the other end (−Y direction in the drawing) of the base part 21 in parallel along the Y-axis. From the shape in which the pair of drive vibrating arms 22a, 22b and the pair of detection vibrating arms 23a, 23b are respectively extended from the ends of the base part 21 in the coaxial directions, the vibration gyro device 1 may be referred to as "H-shaped vibrator element" (H-shaped vibration gyro device). Since the drive vibrating arms 22a, 22b and the detection vibrating arms 23a, 23b are respectively extended from the ends of the base part 21 in the coaxial directions and the drive system and the detection system are separated, in the H-shaped vibration gyro device 1, electrostatic coupling between the electrodes or wires of the drive system and the detection system is reduced and the detection sensitivity becomes stable. Note that, in the embodiment, two of the drive vibrating arms 22a, 22b and the detection vibrating arms 23a, 23b are respectively provided in the example of the H-shaped vibrator element, however, the number of vibrating arms may be one or three or more. Further, a drive electrode and a detection electrode may be formed on one vibrating arm.

Further, the vibration gyro device 1 has the adjustment vibrating arms 25a, 25b as a pair of the second vibrating arms extended in a direction intersecting the crystal X-axis (electrical axis) of the quartz crystal. In the vibration gyro device 1 of the embodiment, the adjustment vibrating arms 25a, 25b are provided from ends of a pair of connecting arms 24a, 24b respectively extended along the X-axis from both ends in a direction orthogonal to the drive vibrating arms 22a, 22b and the detection vibrating arms 23a, 23b of the base part 21 (X-axis direction) in parallel to the drive vibrating arms 22a, 22b. That is, the adjustment vibrating arms 25a, 25b are extended from the ends of the connecting arms 24a, 24b along the Y-axis (in the +Y direction).

The adjustment vibrating arms 25a, 25b as the second vibrating arms are formed to have entire lengths smaller than those of the drive vibrating arms 22a, 22b and the detection vibrating arms 23a, 23b as the first vibrating arms. Thereby, the vibration of the adjustment vibrating arms 25a, 25b for adjustment of leakage output does not hinder the main vibration of the vibration gyro device 1 by the first vibrating arms (the drive vibrating arms and the detection vibrating arms), and thus, the vibration characteristics of the vibration gyro device 1 become stable and advantageous for downsizing of the vibration gyro device 1.

The center of the base part 21 may be the center of gravity as a position of the center of gravity of the vibration gyro device 1. The X-axis, the Y-axis, and the Z-axis are orthogonal to one another and pass the center of gravity. The outer shape of the vibration gyro device 1 may be line-symmetric with respect to a virtual center line passing through the center of gravity in the Y-axis direction. Thereby, the outer shape of the vibration gyro device 1 is balanced and preferable because the characteristics of the vibration gyro device becomes stable and the detection sensitivity is improved.

The outer shape of the vibration gyro device 1 may be formed by etching (wet etching or dry etching) using a photolithography technology. A plurality of the vibration gyro devices 1 may be formed from one quartz crystal wafer.

Next, one embodiment of electrode arrangement of the vibration gyro device 1 will be explained with reference to the drawings.

Figure 2:
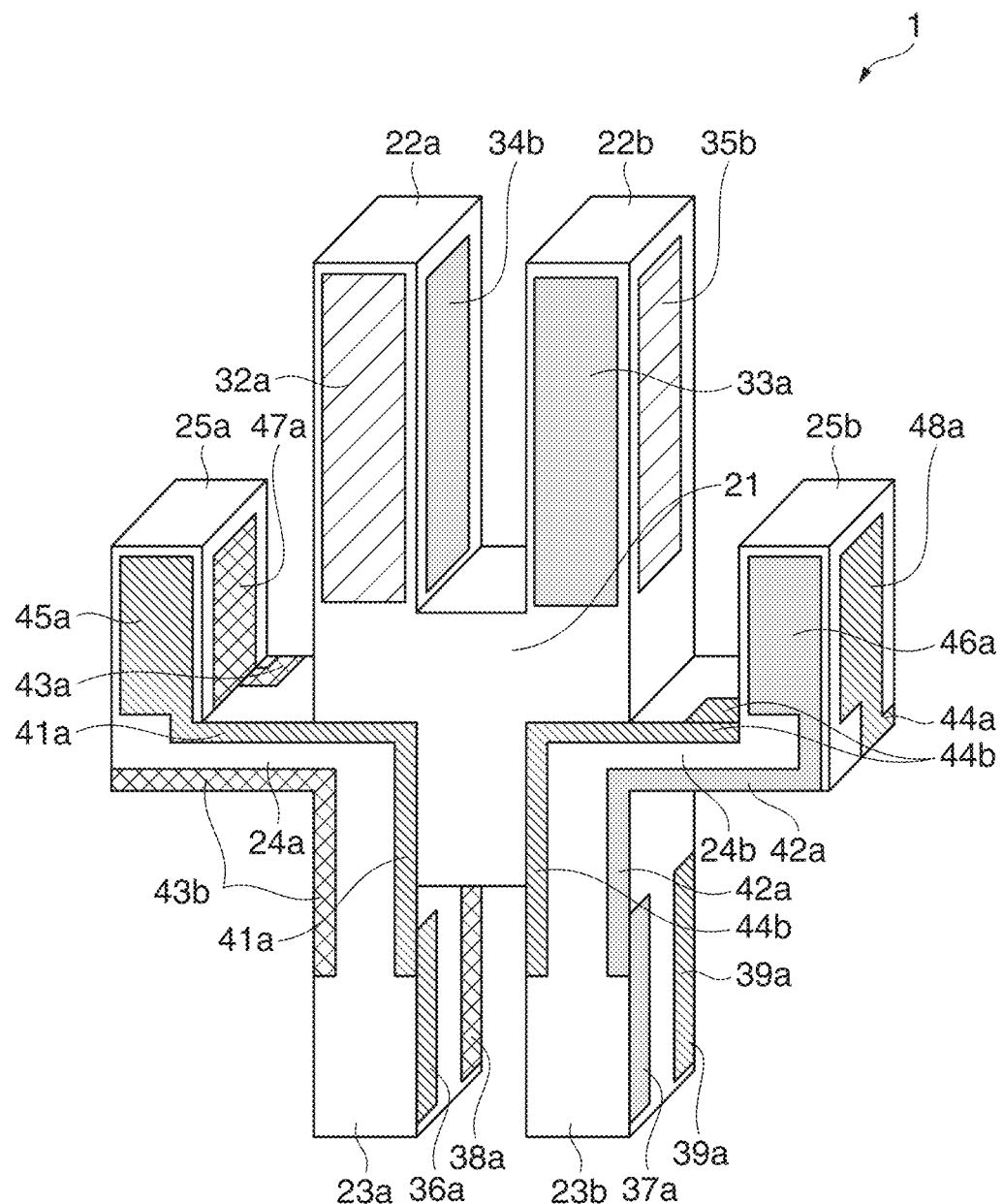
FIG. 2 is a schematic perspective view showing electrode arrangement of the vibration gyro device obliquely seen from one principal surface side.
Figure 3:
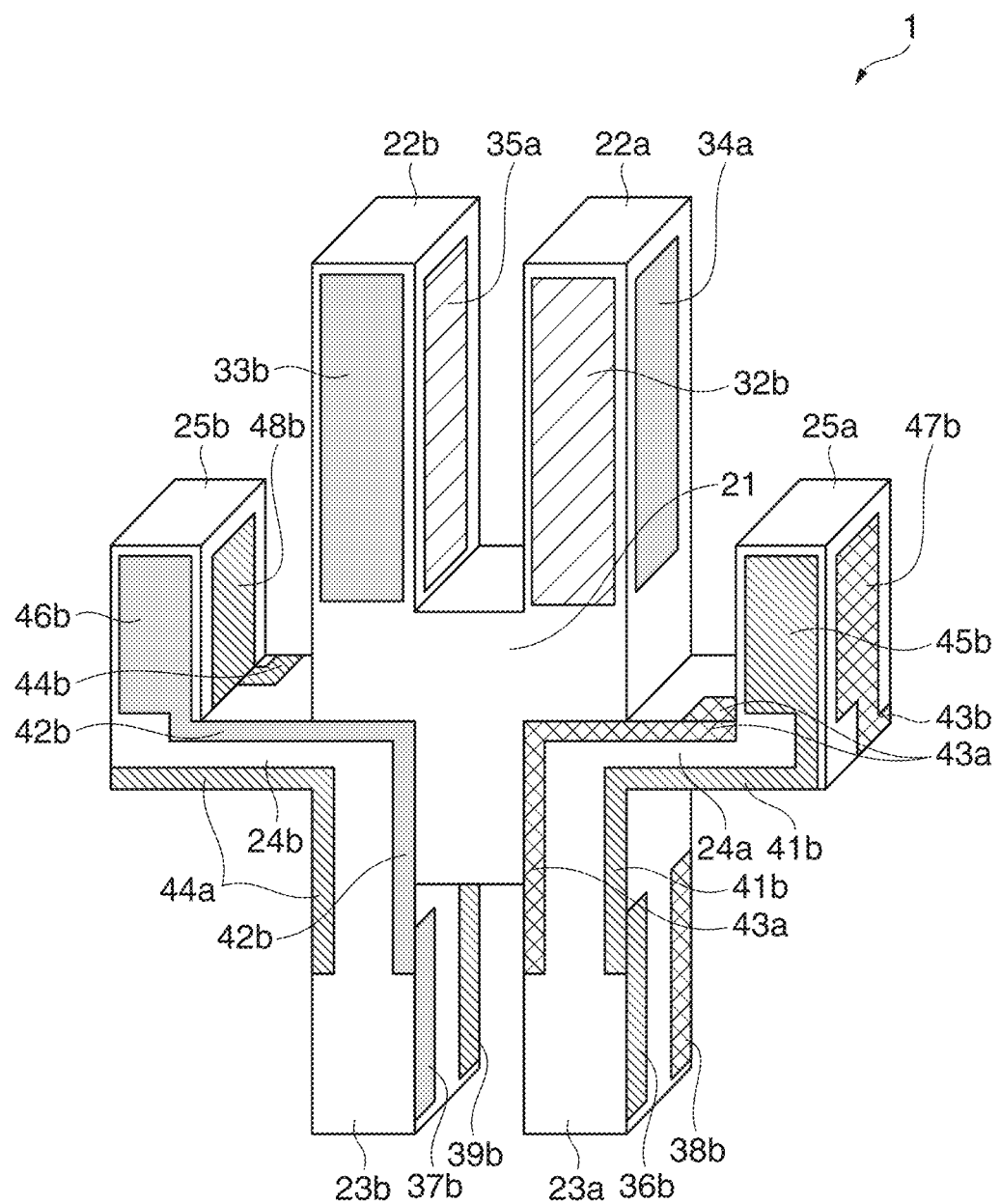
FIG. 3 is a schematic perspective view showing the electrode arrangement of the vibration gyro device from the other principal surface side.

FIG. 2 is a schematic perspective view showing electrode arrangement of the vibration gyro device seen from one principal surface side, and FIG. 3 is a schematic perspective view showing the electrode arrangement of the vibration gyro device obliquely seen from the other principal surface side.

Note that, in FIGS. 2 and 3, the characteristic connection relationships between the electrodes of the detection vibrating arms 23a, 23b and the adjustment vibrating arms 25a, 25b in the electrode arrangement of the embodiment are mainly explained. The connection relationships between the electrodes (drive electrodes) of the drive system provided on the drive vibrating arms 22a, 22b are the same as the connection relationships between the electrodes of the drive system of the vibration gyro device in related art, and their illustration will be omitted.

First, the electrodes provided on the drive vibrating arms 22a, 22b will be explained.

In FIG. 2, drive electrodes 32a, 33a as driving electrodes for applying drive voltages are provided on one principal surfaces of both principal surfaces of the pair of drive vibrating arms 22a, 22b extended from one end of the base part 21 of the vibration gyro device 1 in parallel. Further, drive electrodes 34b, 35b are respectively provided on one side surfaces of both side surfaces of the respective vibrating arms 22a, 22b.

Furthermore, as shown in FIG. 3, drive electrodes 32b, 33b are respectively provided on the other principal surfaces opposed to the one principal surfaces of the respective drive vibrating arms 22a, 22b. Moreover, drive electrodes 34a, 35a are respectively provided on the other side surfaces opposed to the one side surfaces of the respective drive vibrating arms 22a, 22b.

Regarding the drive electrodes 32a, 32b, 33a, 33b and the drive electrodes 34a, 34b, 35a, 35b provided on both principal surfaces and both side surfaces of the respective drive vibrating arms 22a, 22b, the opposed electrodes are connected by connection wires (not shown) so that the opposed principal surfaces (the front surface and the rear surface) and the opposed side surfaces (the inner side surface and the outer side surface) connecting the principal surfaces may be at the same potentials. In the embodiment, in one drive vibrating arm 22a, the drive electrode 32a and the drive electrode 32b provided on both principal surfaces are at the same potential and the drive electrode 34a and the drive electrode 34b provided on both side surfaces are at the same potential. Further, in the other drive vibrating arm 22b, the drive electrode 33a and the drive electrode 33b provided on both principal surfaces are at the same potential and the drive electrode 35a and the drive electrode 35b provided on both side surfaces are electrodes at the same potential. Here, ones of the opposed drive electrodes at the same potential in the respective drive vibrating arms 22a, 22b, for example, the drive electrodes 32a, 32b provided on both principal surfaces of the drive vibrating arm 22a and the drive electrodes 35a, 35b provided on both side surfaces of the drive vibrating arm 22b are ground electrodes.

Next, the electrodes provided on the detection vibrating arms 23a, 23b will be explained.

In FIG. 2, detection electrodes 36a, 38a and detection electrodes 37a, 39a as detection electrodes for detecting distortion of the base material (quartz crystal) generated due to vibration are provided on one side surfaces of both side surfaces of the pair of detection vibrating arms 23a, 23b extended from the other end of the base part 21 of the vibration gyro device 1 in parallel. Specifically, of the pair of detection vibrating arms 23a, 23b, on one side surface of both side surfaces of the detection vibrating arm 23a, a pair of the detection electrodes 36a, 38a at different potentials from each other are provided near both ends along the extension direction of the detection vibrating arm 23a, and, on one side surface of the detection vibrating arm 23b, a pair of the detection electrodes 37a, 39a at different potentials from each other are provided near both ends along the extension direction of the detection vibrating arm 23b.

Further, as shown in FIG. 3, detection electrodes 37b, 39b and detection electrodes 36b, 38b are provided on the other side surfaces opposed to the one side surfaces of the respective detection vibrating arms 23a, 23b. Specifically, of the pair of detection vibrating arms 23a, 23b, on the other side surface of the detection vibrating arm 23a, a pair of the detection electrodes 36b, 38b at different potentials from each other are provided near both ends along the extension direction of the detection vibrating arm 23a, and, on the other side surface of the detection vibrating arm 23b, a pair of the detection electrodes 37b, 39b at different potentials from each other are provided near both ends along the extension direction of the detection vibrating arm 23b.

Furthermore, the opposed detection electrodes on both side surfaces of the respective detection vibrating arms 23a, 23b are at the same potential. That is, on both side surfaces of the detection vibrating arm 23a, the opposed detection electrode 36a and detection electrode 36b are at the same potential and the opposed detection electrode 38a and detection electrode 38b are at the same potential, and, on both side surfaces of the detection vibrating arm 23b, the opposed detection electrodes 37a and 37b are at the same potential and the opposed detection electrode 39a and detection electrode 39b are at the same potential. Here, ones of the opposed detection electrodes at the same potential in the respective detection vibrating arms 23a, 23b, for example, the detection electrodes 38a, 38b provided to be opposed on both side surfaces of the detection vibrating arm 23a and the detection electrodes 39a, 39b provided to be opposed on both side surfaces of the detection vibrating arm 23b are ground electrodes.

Next, electrodes (membranes) as adjustment parts provided on the adjustment vibrating arms 25a, 25b will be explained.

In FIG. 2, adjustment electrodes 45a, 46a as adjustment parts are respectively provided on one principal surfaces of both principal surfaces of the pair of adjustment vibrating arms 25a, 25b extended from the ends of the pair of connecting arms 24a, 24b respectively extended from both ends in a direction orthogonal to the one end and the other end of the base part 21 of the vibration gyro device 1 in parallel to the drive vibrating arms 22a, 22b. Further, on one side surfaces of both side surfaces of the respective adjustment vibrating arms 25a, 25b, adjustment electrodes 47a, 48a as adjustment parts are respectively provided.

Furthermore, as shown in FIG. 3, on the other principal surfaces opposed to the one principal surfaces of the respective adjustment vibrating arms 25a, 25b, adjustment electrodes 45b, 46b as adjustment parts are respectively provided. Moreover, on the other side surfaces opposed to the one side surfaces of the respective adjustment vibrating arms 25a, 25b, adjustment electrodes 47b, 48b as adjustment parts are respectively provided.

In the embodiment, the detection electrodes of the detection vibrating arms 23a, 23b and corresponding adjustment electrodes of the adjustment vibrating arms 25a, 25b are electrically connected.

Specifically, as shown in FIGS. 2 and 3, the detection electrode 36a of the detection vibrating arm 23a and the adjustment electrode 45a of the adjustment vibrating arm 25a are connected via an interelectrode wire 41a, the detection electrode 38a and the adjustment electrode 47a are connected via an interelectrode wire 43a, the detection electrode 36b and the adjustment electrode 45b are connected via an interelectrode wire 41b, and the detection electrode 38b and the adjustment electrode 47b are connected via an interelectrode wire 43b.

Further, the detection electrode 37a of the detection vibrating arm 23b and the adjustment electrode 46a of the adjustment vibrating arm 25b are connected via an interelectrode wire 42a, the detection electrode 39a and the adjustment electrode 48a are connected via an interelectrode wire 44a, the detection electrode 37b and the adjustment electrode 46b are connected via an interelectrode wire 42b, and the detection electrode 39b and the adjustment electrode 48b are connected via an interelectrode wire 44b.

According to the vibration gyro device 1 of the first embodiment, in a direction from both ends in the Y-axis direction of the base part 21 along the Y-axis, in addition to the H-shaped vibrator element configuration in which the pair of drive vibrating arms 22a, 22b and the pair of detection vibrating arms 23a, 23b are extended in parallel, the adjustment vibrating arms 25a, 25b as the second vibrating arms extended from the respective ends of the pair of connecting arms 24a, 24b extended from both ends in the X-axis direction of the base part 21 along the X-axis direction in a direction intersecting the quartz crystal X-axis (the direction along the Y-axis direction in the embodiment) are provided. Further, on both principal surfaces and both side surfaces of the adjustment vibrating arms 25a, 25b, the adjustment electrodes 45a, 45b, 46a, 46b, 47a, 47b, 48a, 48b as membranes electrically connected to the corresponding detection electrodes provided on the detection vibrating arms 23a, 23b are provided.

According to the vibration gyro device 1 having the configuration, the inventors have found that, when an angular velocity is applied to the vibration gyro device 1 under a condition that predetermined excitation signals are applied to the drive vibrating arms 22a, 22b, the adjustment vibrating arms 25a, 25b are excited as the detection vibrating arms 23a, 23b exhibit vibration due to Coriolis force, the weights of the membranes provided on the adjustment vibrating arms 25a, 25b (the adjustment electrodes in the embodiment) are increased or decreased or the volumes of the adjustment electrodes as the membranes are increased or decreased and the amount of change is changed, and thereby, undesirable leakage output of the detection vibrating arms 23a, 23b may be suppressed.

Therefore, for example, reduction of detection sensitivity due to leakage output that can be produced when the sectional shapes of the drive vibrating arms 22a, 22b and the detection vibrating arms 23a, 23b become undesirable shapes due to etching anisotropy, variations in manufacturing, or the like of the quartz crystal as the base material of the vibration gyro device 1 may be suppressed, and a vibration gyro device as a vibrator element with high sensitivity may be provided.

Modified Example 1

In the vibration gyro device 1 of the first embodiment, the effects of the adjustment vibrating arms 25a, 25b that contribute to the higher sensitivity of the vibration gyro device may be further improved by adding shape changes to add masses to their ends.

Figure 4:
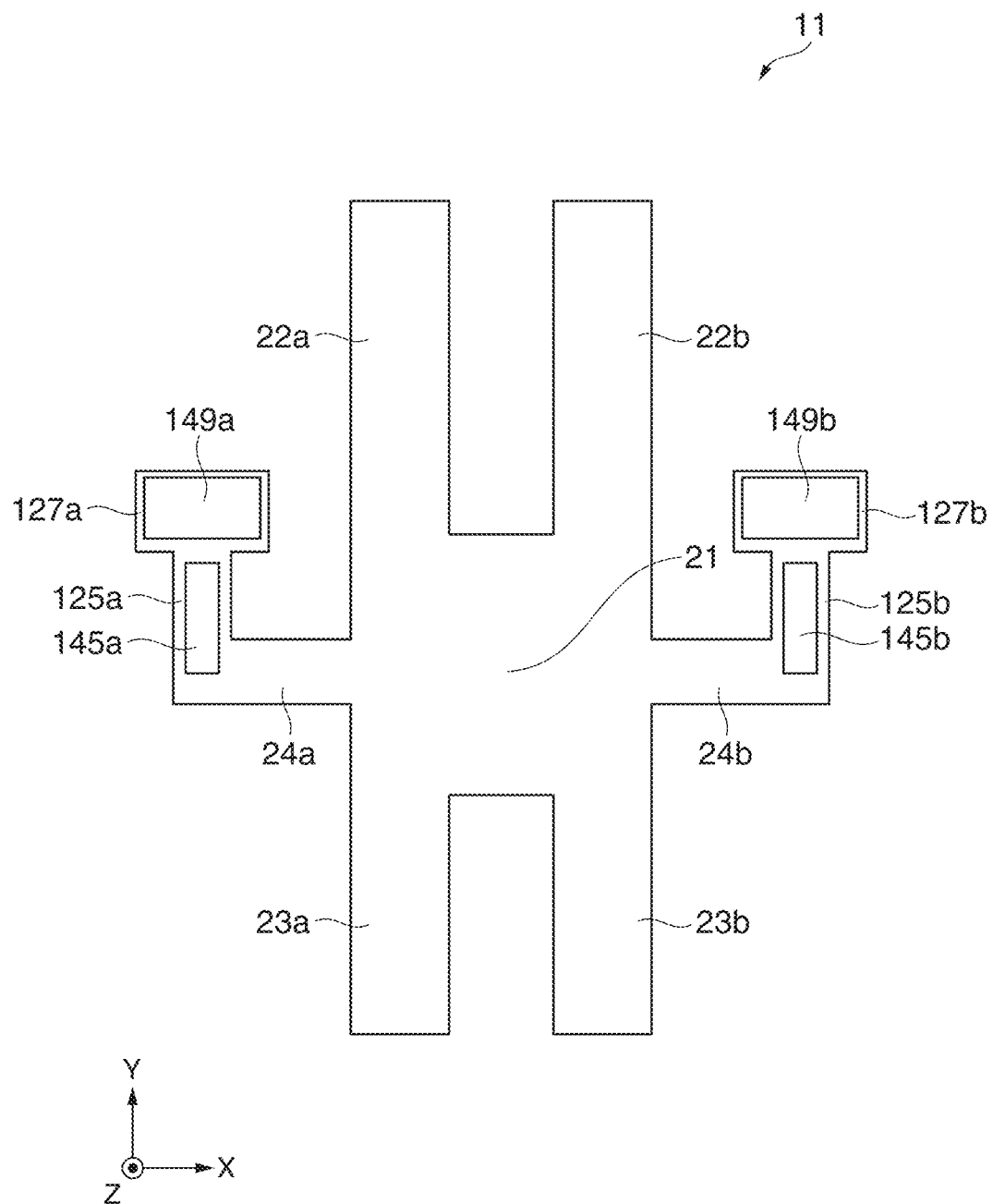
FIG. 4 is a schematic plan view showing modified example 1 of the vibration gyro device.

FIG. 4 is a schematic plan view showing a modified example of the vibration gyro device as a vibrator element provided with wider parts on ends of the adjustment vibrating arms as the second vibrating arms. Note that, in FIG. 4, the same signs are assigned to the same configurations as those of the vibration gyro device 1 of the first embodiment and their explanation will be omitted.

In FIG. 4, a vibration gyro device 11 of the modified example has a base part 21 having the same configuration as that of the vibration gyro device 1 of the first embodiment, a pair of drive vibrating arms 22a, 22b and a pair of detection vibrating arms 23a, 23b respectively extended from both ends in the Y-axis direction of the base part 21. Further, adjustment vibrating arms 125a, 125b extended from respective ends of connecting arms 24a, 24b respectively extended from both ends in the X-axis direction of the base part 21 in parallel to the drive vibrating arms 22a, 22b are provided.

On principal surfaces of the respective adjustment vibrating arms 125a, 125b, adjustment electrodes 145a, 145b as membranes for adjustment of leakage output of the vibration gyro device 11 are respectively provided. Note that, though their illustration is omitted, the adjustment electrodes may be provided on both principal surfaces and both side surfaces of the respective adjustment vibrating arms as is the case of the vibration gyro device 1 of the above described embodiment.

At the end sides of the respective adjustment vibrating arms 125a, 125b, spindle parts 127a, 127b as wider parts having nearly rectangular shapes with larger widths (larger lengths in the X-axis direction) than other parts are provided. On the surfaces of the respective spindle parts 127a, 127b, membranes 149a, 149b are provided. Note that, though their illustration is omitted, the membranes may be provided on both principal surfaces and both side surfaces of the spindle parts 127a, 127b of the adjustment vibrating arms 125a, 125b.

Further, the membranes 149a, 149b may be formed using the same metal material as that of the other electrodes or formed using a non-conducting material. By forming the membranes 149a, 149b using the same metal material as that of the other electrodes, they may be efficiently manufactured concurrently with the other electrodes. Further, according to the formation of the membranes 149a, 149b using a non-conducting material, there is an advantage of providing a wider range of choice of the membrane formation material, and it is preferable to use a material with the highest density (with the highest specific gravity) as the membrane formation material.

According to the vibration gyro device 11 of modified example 1, the adjustment vibrating arms 125a, 125b that exert the suppression effect of leakage vibration like the adjustment vibrating arms 25a, 25b as the second vibrating arms explained in the vibration gyro device 1 of the first embodiment are provided and the spindle parts 127a, 127b as the wider parts are provided at the end sides of the respective adjustment vibrating arms 125a, 125b. Thereby, the suppression effect of leakage vibration may be improved while the increase in length of the adjustment vibrating arms is suppressed and the adjustment range for suppression of the leakage vibration may be taken wider, and fine adjustment for suppression of leakage vibration may be made and the vibration gyro device 11 with higher sensitivity may be provided.

Second Embodiment

Gyro Sensor

Next, a gyro sensor as a sensor unit including the vibration gyro device will be explained with reference to the drawings.

Figure 5A:
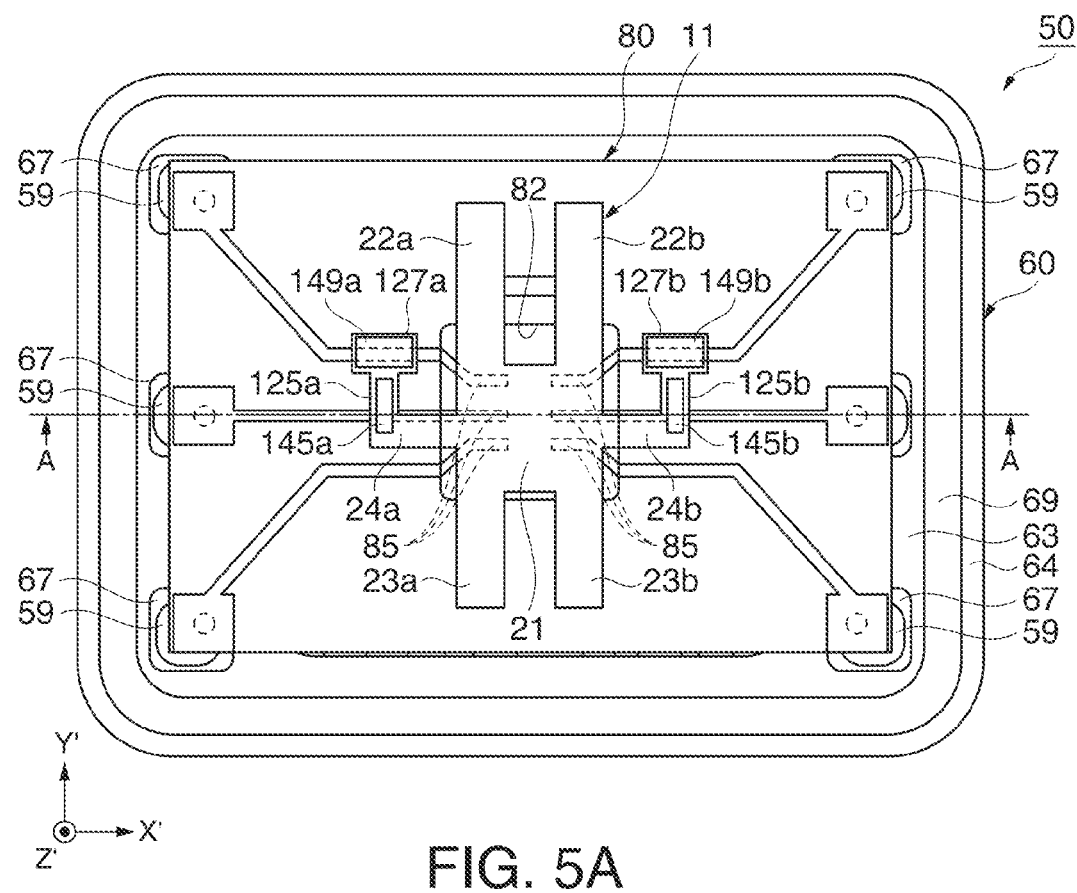
FIG. 5A is a schematic plan view for explanation of a gyro sensor as a sensor unit including the vibration gyro device seen from above.
Figure 5B:
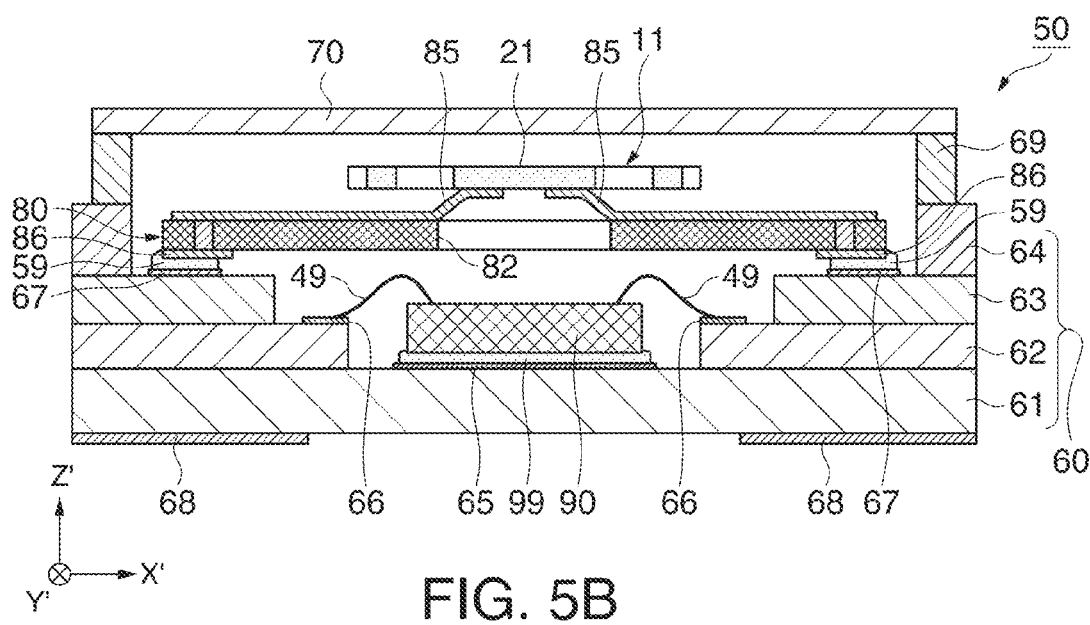
FIG. 5B is a sectional view along A-A line in FIG. 5A.

FIGS. 5A and 5B are diagrams for explanation of one embodiment of the gyro sensor, and FIG. 5A is a schematic plan view seen from above and FIG. 5B is a schematically sectional view along A-A line in FIG. 5A.

Note that, in FIG. 5A, for convenience of explanation of the structure inside of the gyro sensor, a state in which a lid 70 as a lid member provided in the upper part of the gyro sensor is detached is shown. Further, in the configuration of a gyro sensor 50 of the embodiment, an example in which the vibration gyro device 11 including the adjustment vibrating arms 125a, 125b as the second vibrating arms having the spindle parts 127a, 127b as the wider parts of the modified example 1 as a vibrator element will be explained.

As shown in FIGS. 5A and 5B, the gyro sensor 50 has a package 60 having a recess part, the lid 70 as a lid member that closes an opening part of the package 60, the vibration gyro device 11 bonded within the package 60 via a relay board 80, and an IC chip 90 as an electronic component.

In the package 60, for example, on a flat plate-like first layer substrate 61, a second layer substrate 62, a third layer substrate 63, and a fourth layer substrate 64 having rectangular annular shapes with opening parts in different sizes are stacked in this order to form a recess part having steps and projections so that the vibration gyro device 11 and the IC chip 90 may be held within the recess part. As a material for the package 60, for example, ceramic, glass, or the like may be used.

On the first layer substrate 61 to be a recess bottom part of the recess part of the package 60, a die pad 65 on which the IC chip 90 is placed is provided. Further, on a surface different from the surface on which the die pad 65 of the first layer substrate 61 is provided to be an outer bottom surface of the package 60, external mounting terminals 68 for bonding to an external substrate are provided.

In the recess part of the package 60, on steps formed to surround the die pad 65 by the second layer substrate 62, plural IC connection terminals 66 bonded to corresponding plural electrode pads (not shown) provided on an active surface (the upper surface in FIG. 5B) of the IC chip 90 are provided.

Further, on the second layer substrate 62 provided with the plural IC connection terminals 66, on steps formed to surround the IC connection terminals 66 by the third layer substrate 63, vibrator element connection terminals 67 to which the vibration gyro device 11 is bonded via the relay board 80 are provided.

Regarding the various terminals provided on the package 60, corresponding terminals are connected via interlayer wires such as routing wires and through holes (not shown).

The IC chip 90 has a drive circuit as exciting means for driving and vibrating the vibration gyro device 11, and a detection circuit as detecting means for detecting detected vibration generated in the vibration gyro device 11 when an angular velocity is applied. Specifically, the drive circuit of the IC chip 90 supplies drive signals to the drive electrodes 33a, 33b and the drive electrodes 34a, 34b (see FIGS. 2 and 3) formed on the pair of drive vibrating arms 22a, 22b of the vibration gyro device 11, respectively. Further, the detection circuit of the IC chip 90 amplifies detection signals generated in the detection electrodes 36a, 36b and the detection electrodes 37a, 37b formed on the detection vibrating arms 23a, 23b of the vibration gyro device 11, respectively, to generate amplified signals, and detects a rotation angular velocity applied to the gyro sensor 50 based on the amplified signals.

The IC chip 90 is bonded and fixed onto the die pad 65 provided in the recess bottom part of the recess part of the package 60 using a brazing filler metal (die attach material) 99, for example. Further, in the embodiment, the IC chip 90 and the package 60 are electrically connected using wire bonding. That is, the plural electrode pads provided on the IC chip 90 and corresponding IC connection terminals 66 of the package 60 are connected via bonding wires 49.

Within the recess part of the package 60, above the IC chip 90, the vibration gyro device 11 is bonded via the relay board 80.

The relay board 80 is a wiring board for supporting the vibration gyro device 11 while providing predetermined elasticity without forming a complex support structure that supports the vibration gyro device 1 within the recess part of the package 60 and relaying the electrical connection between the vibration gyro device 11 and the package 60. The relay board 80 of the embodiment has an insulating base material having an opening part (device hole) 82 provided in a region where the base part 21 in which the support part of the vibration gyro device 11 is provided is located, plural electrode leads 85 provided on one principal surface of the base material, and connection electrodes 86 electrically connected to corresponding electrode leads 85 by the interlayer wires of the base material or the like. The plural electrode leads 85 are extended with one end side provided on the base material and the other end side overhung toward the center of the opening part 82 of the base material.

The parts of the respective electrode leads 85 overhung in the opening part 82 are once bent obliquely upward (toward the lid 70 side) in the middle from the base material toward the center of the opening part 82, and horizontally bent toward the center of the opening part 82 again. The other end sides (ends) of the respective electrode leads 85 are provided in positions corresponding to external connection terminals (not shown) provided on the base part 21 of the vibration gyro device 11, and contribute to electrical connection and mechanical bonding of the vibration gyro device 11.

For the relay board 80, for example, a known TAB board for TAB (Tape Automated Bonding) mounting may be used. By using the TAB board on which many relay boards 80 are formed at equal intervals on an insulating base material having a hoop shape, the process from manufacturing of the relay board 80 to mounting of the vibration gyro device 11 may be continuously performed with efficiency.

Note that, not limited to the TAB board explained in the embodiment, the relay board 80 may have a configuration formed by a lead frame, for example.

Bonding of the relay board 80 to the vibration gyro device 11 is performed by a method of forming a metal layer of, for example, tin (Sn), gold (Au), or the like for bonding on the surfaces of the electrode leads 85 by plating or the like in advance, further forming a metal layer for bonding on the external connection electrodes (not shown) provided on the base part 21 of the vibration gyro device 11, aligning the respective electrode leads 85 with corresponding external connection electrodes, and heating and pressurizing them for metal eutectic or metal bonding. As another bonding method, a method of bonding via a bonding member such as a metal bump or conducting adhesive (flip-chip bonding) or the like may be applied.

The vibration gyro device 11 extended and overhanging the opening part 82 of the relay board 80 and bonded via the plural electrode leads 85 is flexibly supported because of the elasticity of the foamed electrode leads 85. Thereby, when an impact is applied to the gyro sensor 50 due to dropping or the like, the impact is relaxed by the electrode leads 85 and failures of breakage of the vibration gyro device 11 or the like is avoidable, and thus, an effect of improving impact resistance of the gyro sensor 50 is exerted.

The relay board 80 to which the vibration gyro device 11 has been bonded is bonded above the IC chip 90 within the recess part of the package 60. Specifically, the connection electrodes 86 electrically connected to the plural electrode leads 85 of the relay board 80 connected to the vibration gyro device 11 and provided on the surface of the relay board 80 different from the surface to which the vibration gyro device 11 has been bonded are aligned with the vibrator element connection terminals 67 provided on the steps formed by the third layer substrate 63 of the package 60, and bonded and fixed with electrical connection using bonding members 59 such as conducting adhesives, for example.

Note that, in the embodiment, the form in which the vibration gyro device 11 is bonded within the package 60 via the relay board 80 has been explained, however, the support structure is not limited as long as vibration leakage of the vibration gyro device 11 may not occur. For example, a support part having connection terminals may be provided within the recess part of the package 60 and a support structure that bonds and supports the vibration gyro device 11 may be formed in the support part.

On the package 60 on which the IC chip 90 and the vibration gyro device 11 are bonded, the lid 70 as the lid member is provided to seal the opening of the package 60. As a material of the lid 70, for example, a metal such as 42 Alloy (an alloy containing 42% of nickel in iron) or Kovar (an alloy of iron, nickel, and cobalt), ceramics, glass, or the like may be used. For example, the lid 70 made of a metal is bonded to the package 60 by seam welding via a seal ring 69 that has been formed by punching out Kovar alloy or the like into a rectangular annular shape. The recess part space formed by the package 60 and the lid 70 is a space for the vibration gyro device 11 to operate.

The recess part space may be air-tightly sealed in a decompressed space or an inert gas atmosphere (details will be described later).

According to the gyro sensor 50 having the above described configuration, in addition to the effects of the adjustment vibrating arms 25a, 25b (see FIGS. 1 to 3) as the second vibrating arms of the vibration gyro device 1 that have been explained in the first embodiment, the vibration gyro device 11 having the adjustment vibrating arms 125a, 125b having the spindle parts 127a, 127b as the wider part at the end sides are provided. Thereby, adjustment for suppressing leakage output can be performed and a gyro sensor as a sensor unit with high detection sensitivity may be provided.

Third Embodiment

Manufacturing Methods of Gyro Device and Gyro Sensor

Next, manufacturing methods of a gyro device and a gyro sensor will be explained by taking one embodiment of a manufacturing method of a gyro sensor as a sensor unit of the second embodiment as an example.

Figure 6:
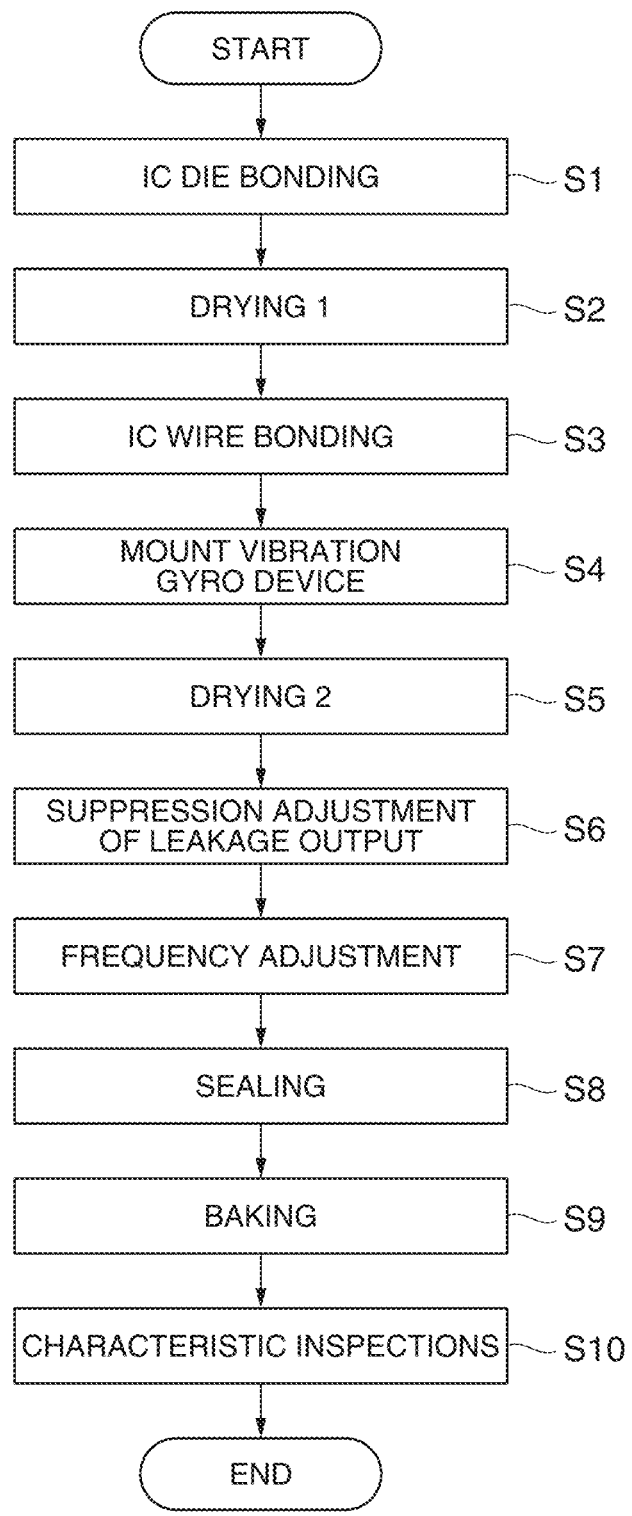
FIG. 6 is a flowchart showing a manufacturing method of a gyro sensor (second embodiment).

FIG. 6 is a flowchart for explanation of an example of a manufacturing method of a gyro sensor as a sensor unit. Further, FIGS. 7A to 8C are explanatory diagrams respectively showing examples of phase relationships between a detection vibrating arm of the first vibrating arms and an adjustment vibrating arm as the second vibrating arm of the vibration gyro device at a leakage output suppression adjustment step of the manufacturing method of the sensor unit.

In FIG. 6, in a manufacturing process of the gyro sensor 50, first, the package 60 shown in FIGS. 5A and 5B is prepared, and, as shown by step S1, the IC chip 90 is die-bonded to the die pad 65 provided in the recess bottom part of the recess part of the package 60. Specifically, a die attach material (not shown) is applied onto the die pad 65 in an appropriate amount, and then, the IC chip 90 is aligned and mounted (temporarily fixed). Then, as shown by step S2, at drying 1 step at which drying of the die attach material of solidifying the die attach material by heating at predetermined temperature and time, and thereby, the IC chip 90 is bonded and fixed onto the die pad 65.

Then, as shown by step S3, wire bonding to connect the IC chip 90 and the package 60 is performed by a wire bonding method.

The connection between the IC chip 90 and the package 60 is made by connecting the plural IC connection terminals 66 provided on the second layer substrate 62 of the package 60 and corresponding electrode pads (not shown) of the IC chip 90 using the bonding wires 49.

Then, as shown by step S4, the vibration gyro device 11 as the vibrator element is mounted above the IC chip 90 within the recess part of the package 60. For example, as has been explained in the second embodiment, the vibration gyro device 11 may be bonded to the package 60 via the relay board 80. In this case, first, the vibration gyro device 11 is bonded to the relay board 80. The bonding of the vibration gyro device 11 to the relay board 80 may be performed by a method of forming a metal layer of, for example, tin, gold, or the like for bonding on the surfaces of the electrode leads 85 in advance, further forming a metal layer for bonding on the external connection electrodes (not shown) provided on the base part 21 of the vibration gyro device 11, aligning the respective electrode leads 85 with corresponding external connection electrodes, and heating and pressurizing them for metal eutectic or metal bonding. Then, the connection electrodes 86 electrically connected to the plural electrode leads 85 connected to the vibration gyro device 11 of the relay board 80 bonded to the vibration gyro device 11 and provided on the surface of the relay board 80 different from the surface bonded to the vibration gyro device 11 are aligned with the vibrator element connection terminals 67 provided on the steps formed by the third layer substrate 63 of the package 60, and temporarily fixed using the bonding members 59 such as conducting adhesives, for example. Then, the bonding members 59 are solidified and the relay board 80 bonded to the vibration gyro device 11 is bonded and fixed with electrical connection within the package 60. In the case where the bonding members 59 are thermosetting, as shown by step S5, the solidification of the bonding members 59 may be performed at drying 2 step of heating at predetermined temperature and time.

Note that, for example, when the bonding members 59 are ultraviolet curable, bonding and fixing of the relay board 80 bonded to the vibration gyro device 11 may be performing by applying an ultraviolet ray with predetermined intensity to the bonding members 59 in a predetermined time and solidifying them, and the methods may be selected depending on how to cure the bonding members 59.

Next, as shown by step S6, suppression adjustment of leakage output of the vibration gyro device 11 bonded together with the IC chip 90 to the package 60 is performed.

First, a principle of a suppression adjustment method of leakage output of the vibration gyro device 11 will be explained.

The inventors have found that, as the vibration gyro device 11 (see FIG. 4), in the configuration in which the adjustment vibrating arms 125a, 125b extended along the Y-axis direction from the respective ends of the connecting arms 24a, 24b extended from both ends in the X-axis direction of the base part 21 along the X-axis direction are provided in the H-shaped vibrator element having the drive vibrating arms 22a, 22b and the detection vibrating arms 23a, 23b respectively extended from both ends in the Y-axis direction of the base part 21, the vibration direction of leakage output is determined depending on the finished shape due to variations in etching of the respective vibrating arms, and adjustment of suppressing leakage output in response thereto is effective.

Figure 7A:
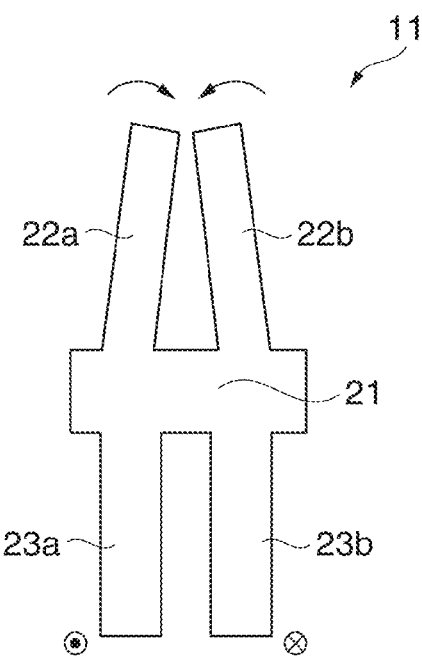
FIGS. 7A to 7C are explanatory diagrams showing phase relationships between a detection vibrating arm of first vibrating arms and an adjustment vibrating arm as second vibrating arms of the vibration gyro device.
Figure 7B:
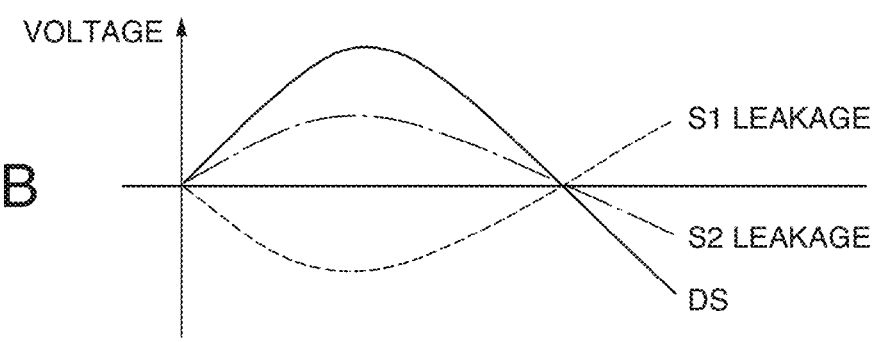
Figure 7C:
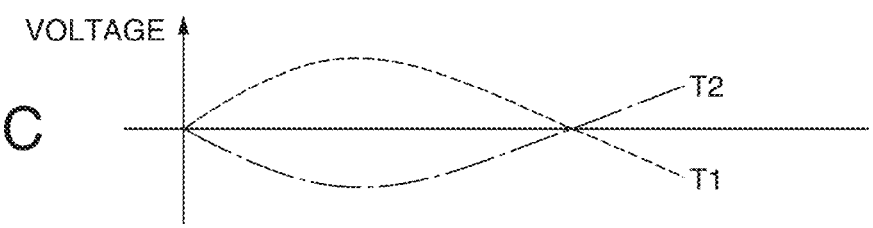

Specifically, when the vibration gyro device 11 moves as shown in FIG. 7A at driving, the output waveform DS of the drive vibrating arms 22a, 22b and output waveforms S1 leakage, S2 leakage of the respective leakage outputs of the detection vibrating arms 23a, 23b exhibit waveforms shown in FIG. 7B. To cancel out the leakage outputs, it is necessary to set the phases of the respective adjustment vibrating arms 125a, 125b to phases T1, T2 shown in FIG. 7C. For the purpose, it is necessary to set the drive vibrating arms 22a, 22b and the adjustment vibrating arms 125a, 125b at opposite phases.

Figure 8A:
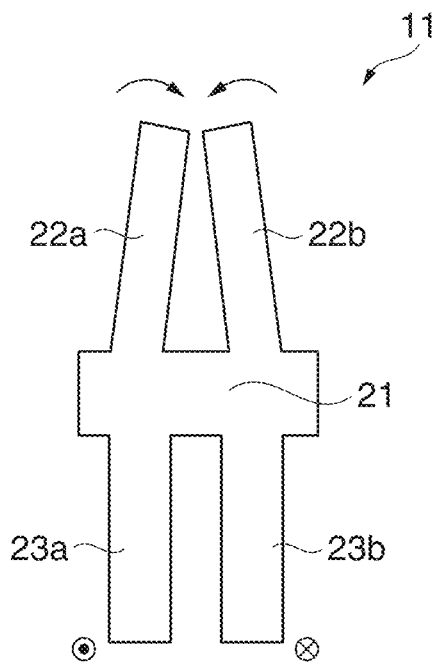
FIGS. 8A to 8C are explanatory diagrams showing phase relationships between the detection vibrating arm of first vibrating arms and the adjustment vibrating arm as a second vibrating arm of the vibration gyro device.
Figure 8B:
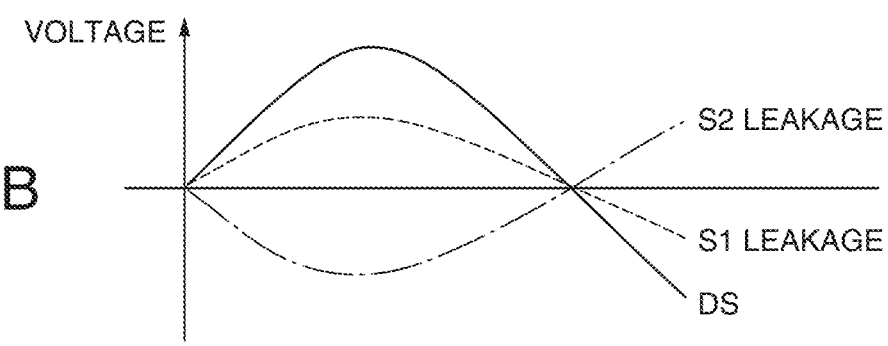
Figure 8C:
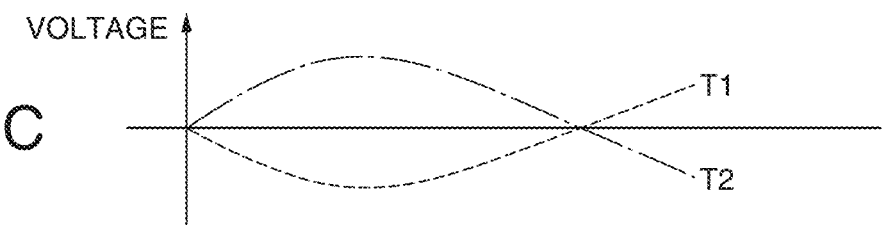

Further, when the vibration gyro device 11 moves as shown in FIG. 8A at driving, the output waveform DS of the drive vibrating arms 22a, 22b and output waveforms S1 leakage, S2 leakage of the respective leakage outputs of the detection vibrating arms 23a, 23b exhibit waveforms shown in FIG. 8B. To cancel out the leakage outputs, it is necessary to set the phases of the respective adjustment vibrating arms 125a, 125b to phases T1, T2 shown in FIG. 8C. For the purpose, it is necessary to set the drive vibrating arms 22a, 22b and the adjustment vibrating arms 125a, 125b at the same phase.

The vibration direction of the leakage output varies depending on the finished shape due to variations in processes of the respective vibrating arms as described above. For example, in the case where the vibrating arms having rectangular sections are designed, the sections may be parallelogram shapes, trapezoidal shapes, or rhombic shapes due to etching anisotropy of quartz crystal as the base material, and the vibration direction of leakage output is affected.

Here, the inventors have found that, given that the resonance frequency of the drive vibrating arms 22a, 22b is $f_d$ and the resonance frequency of the adjustment vibrating arms 125a, 125b is $f_t$, relationships in which the phase of the drive vibrating arms 22a, 22b and the phase of the adjustment vibrating arms 125a, 125b are the same or opposite hold in response to the relationship between $f_d$ and $f_t$ as follows. That is, the inventors have confirmed that, if $f_d < f_t$, the phase of the drive vibrating arms 22a, 22b and the phase of the adjustment vibrating arms 125a, 125b are opposite, and, if $f_d > f_t$, the phase of the drive vibrating arms 22a, 22b and the phase of the adjustment vibrating arms 125a, 125b are the same.

Next, an example of the suppression adjustment method of leakage output of the vibration gyro device 11 in consideration of the relationships between the various vibrating arms will be explained.

First, by decreasing or increasing the masses of the adjustment vibrating arms 125a, 125b by removing or adding parts of the membranes provided on the adjustment vibrating arms 125a, 125b or grinding the substrates of the adjustment vibrating arms 125a, 125b, the resonance frequencies are changed, and thereby, the relationship between the resonance frequency $f_d$ of the drive vibrating arms 22a, 22b and the resonance frequency $f_t$ of the adjustment vibrating arms 125a, 125b is adjusted to be an appropriate relationship. Specifically, phase adjustment of adjusting the phase relationship between $f_d$ and $f_t$ to a desired relationship ($f_d < f_t$ or $f_d > f_t$) by changing the resonance frequencies by decreasing or increasing the masses of the spindle parts 127a, 127b by trimming the membranes 149a, 149b of the spindle parts 127a, 127b as the wider parts provided at the ends of the respective adjustment vibrating arms 125a, 125b by applying lasers, for example, or adding the same type or a different type of membranes as or from the membranes 149a, 149b by evaporation or sputtering.

The phase adjustment is performed, and then, suppression adjustment of leakage output is performed. Specifically, by decreasing or increasing the amount of charge by removing parts of the adjustment electrodes 145a, 145b provided on the adjustment vibrating arms 125a, 125b by laser application, for example, or adding metals for electrodes by evaporation or sputtering, the influence of leakage output is suppressed to the minimum. Note that, in this case, it is desirable that the adjustment electrodes 145a, 145b of the adjustment vibrating arms 125a, 125b and the detection electrodes (not shown) of the detection vibrating arms 23a, 23b are electrically connected like those in the vibration gyro device 1 of the first embodiment.

Note that, though illustration has been omitted in FIG. 4, the configurations of the various electrodes of the vibration gyro device 11 may conform the electrode configurations of the vibration gyro device 1 of the first embodiment.

As described above, at the leakage output suppression adjustment step of the embodiment, first, the leakage output is fine-adjusted by first adjusting the resonance frequency $f_d$ of the drive vibrating arms 22a, 22b and the resonance frequency $f_t$ of the adjustment vibrating arms 125a, 125b in the appropriate relationship, and then, changing the amount of charge by removing or adding parts of the adjustment electrodes 145a, 145b of the adjustment vibrating arms 125a, 125b.

Note that, for example, in the case of a vibration gyro device having a configuration without spindle parts as wider parts on the adjustment vibrating arms, leakage output suppression adjustment may be performed not by the above described two-step leakage output suppression adjustment but by removing or adding parts of the membranes such as adjustment electrodes provided on the adjustment vibrating arms or the like.

The suppression adjustment of leakage output is performed, and then, as shown by step S7, fine adjustment of the frequency of the vibration gyro device 11 bonded together with the IC chip 90 to the package 60 is performed. The frequency adjustment may be performed using a method of decreasing the masses by removing parts of electrodes of the vibration gyro device 11 by laser trimming, a method of adding a mass to the vibration gyro device 11 by evaporation or sputtering, or a method of rewriting data of the IC chip 90, or the like.

Then, as shown by step S8, the lid 70 as a lid member made of a metal, for example, is bonded in the upper part of the package 60 by seam welding via the seal ring 69 of an iron-nickel alloy or the like, for example, and the package 60 containing the vibration gyro device 11 and the IC chip 90 is sealed.

Further, as another bonding method of the lid 70, the lid 70 may be bonded onto the package 60 via a brazing filler metal such as solder, or the lid 70 of glass is used and bonded onto the package 60 using low-melting-point glass or the like.

At the sealing step, according to need, the cavity formed by the package 60 and the lid 70 may be air-tightly sealed in a decompressed space or an inert gas atmosphere. For example, when the interior of the cavity is decompressed and air-tightly sealed, a solid sealing material is placed in sealing holes (not shown) of the package 60, the package is put into a vacuum chamber and decompressed to a predetermined degree of vacuum, a gas from inside of the gyro sensor is ejected from the sealing holes, and then, the solid sealing material is melted and solidified to close the sealing holes for sealing. As a material of the sealing material, a material having a melting point higher than the reflow temperature when the completed gyro sensor 50 is mounted on an external mounting board, and, for example, an alloy of gold and tin (Sn), an alloy of gold and germanium (Ge), or the like may be used. Thereby, the vibration gyro device 11 and the IC chip 90 bonded within the recess part of the package 60 may be air-tightly sealed.

Then, as shown by step S9, baking of putting the sealed gyro sensor in an oven at a predetermined temperature in a predetermined period is performed.

Then, as shown by step S10, characteristic inspections such as electrical characteristic inspection and appearance inspection are performed and defective products below standard are removed, and the series of manufacturing process of the gyro sensor is ended.

According to the manufacturing method of the third embodiment, adjustment for suppression of leakage output is performed by removing or adding parts of the adjustment electrodes 145a, 145b as the membranes of the adjustment vibrating arms 125a, 125b as the second vibrating arms or the membranes 149a, 149b provided on the vibration gyro device 11. Thereby, reduction of detection sensitivity due to influence by the leakage output may be suppressed and the gyro sensor as the sensor unit having high sensitivity may be provided.

Fourth Embodiment

Next, another embodiment of the manufacturing method of the gyro sensor than the manufacturing method of the third embodiment will be explained.

Figure 9:
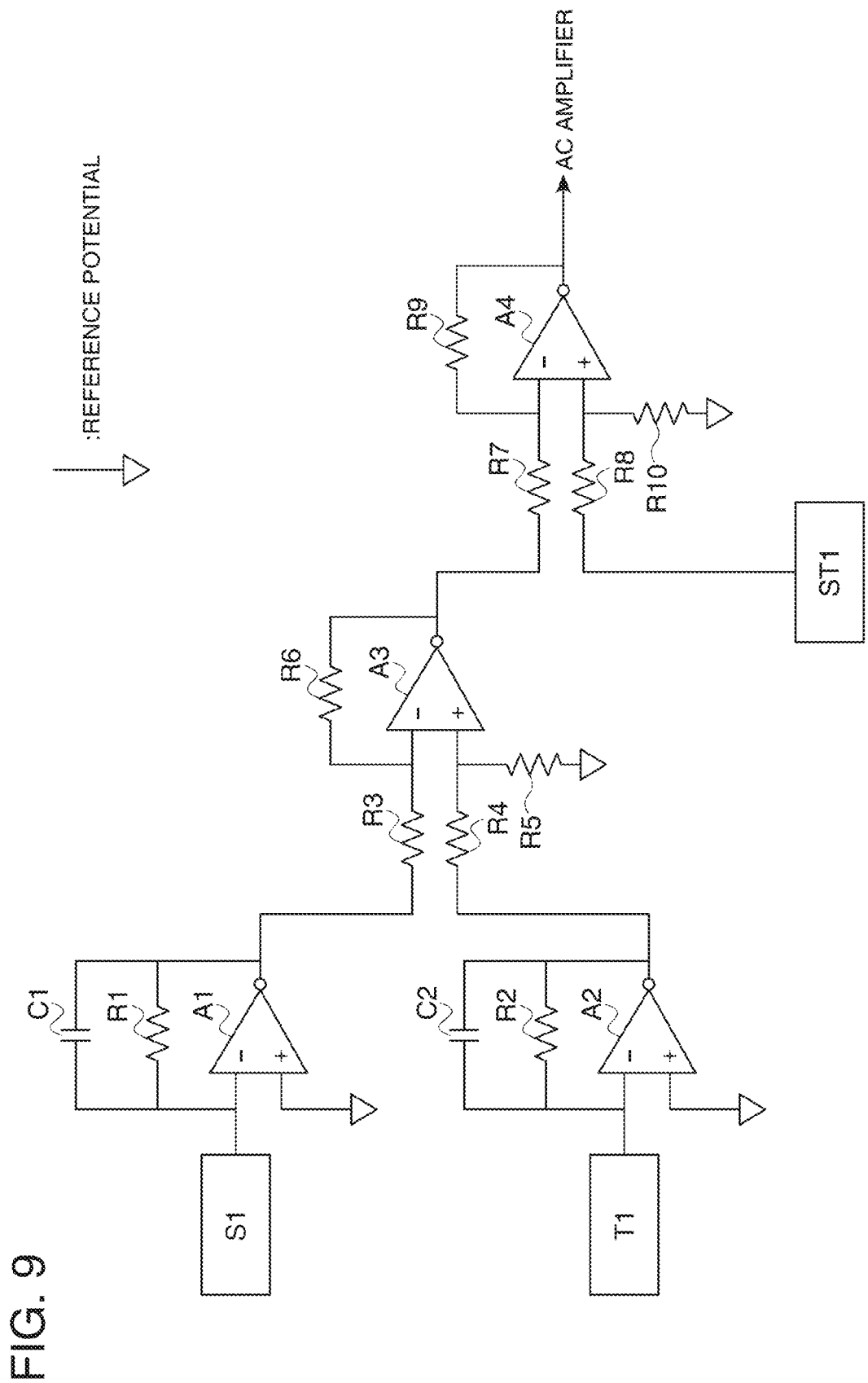
FIG. 9 is a block diagram for explanation of another embodiment (fourth embodiment) of the manufacturing method of a gyro sensor than the third embodiment.

FIG. 9 is a block diagram schematically showing another embodiment (fourth embodiment) of the gyro sensor.

In FIG. 9, S1 denotes an output from one detection electrode of the pair of detection electrodes (see FIGS. 2 and 3) provided on one side surface of the detection vibrating arm as the first vibrating arm, T1 denotes an output of one adjustment electrode corresponding to the output S1 of the detection electrode of the pair of adjustment electrodes provided on one side surface of the adjustment vibrating arm as the second vibrating arm, and ST1 denotes an output signal indicating a difference between the output S2 of the other detection electrode and the output T2 of the other adjustment electrode.

Note that, in the manufacturing method of the gyro sensor of the embodiment, the steps other than the suppression adjustment step of the leakage output of the vibration gyro device are the same as those of the third embodiment, and their explanation will be omitted.

The drive signals are applied from a self-oscillation circuit (not shown) to the drive electrodes of the vibration gyro device, and the flexural vibration mode of the drive vibrating arms of the vibration gyro device is excited.

A current detection circuit including an operation amplifier A1, a resistor R1, and a capacitor C1 is connected to the output S1 of one detection electrode.

Thereby, the potential of the output S1 from the detection electrode is fixed to the reference potential by virtual grounding of the operation amplifier A1. As a result, the detection electrode outputting S1 detects detection signals of the detection vibrating arms in response to the angular velocity applied to the vibration gyro device that excites the flexural vibration mode.

Further, a current detection circuit including an operation amplifier A2, a resistor R2, and a capacitor C2 is connected to the output T1 of one adjustment electrode. In the current detection circuit, by changing circuit constants of the circuit elements of the resistor R2, the capacitor C2, etc., the leakage output may be adjusted to be lower.

The outputs of the two current detection circuits including outputs in which the leakage output has been adjusted to be lower are connected to an amplifier including an operation amplifier A3 and a resistor R6 via resistors R3, R4, respectively. This amplifier is an amplifier that obtains a difference between the output S1 of the detection electrode and the output T1 of the adjustment electrode.

The output from the amplifier and the output signal ST1 indicating the difference between the output S2 of the other detection electrode and the output T2 of the other adjustment electrode are connected to an amplifier including an operation amplifier A4 and a resistor R9 via resistors R7, R8, respectively. This amplifier is an amplifier that obtains a difference between the output S1 and the output S2 of the detection electrodes in which the leakage output has been adjusted to be lower. In the signal input to the amplifier, noise other than the vibration mode component generated by Coriolis force proportional to the angular velocity applied to the excited vibration gyro device is reduced. Then, the signal output from the amplifier is connected to an AC amplifier.

According to the above described manufacturing method of the fourth embodiment, by adjusting the circuit constant of the circuit element of the current detection circuit connected to the output T1 from one adjustment electrode of the circuits forming the gyro sensor, the output T1 from the adjustment electrode may be adjusted so that the output from the operational amplifier A3 may be lower. Therefore, the step of trimming the adjustment electrodes using lasers or the like or adding the adjustment electrodes (membranes) by sputtering or evaporation is not necessary, and the gyro sensor with high sensitivity in which the leakage output has been suppressed in the relatively simple process may be manufactured.

Further, according to the manufacturing method of the gyro sensor of the embodiment, unlike the vibration gyro device 1 of the first embodiment, it is not necessary to connect the adjustment electrodes provided on the adjustment vibrating arms 25a, 25b as the second vibrating arms to corresponding detection electrodes. Thereby, an effect of easy manufacturing without complex electrode structures is exerted.

Modified Example 2

In the vibration gyro device 1 of the first embodiment, in the H-shaped vibrator element having the drive vibrating arms 22a, 22b and the detection vibrating arms 23a, 23b as the first vibrating arms respectively extended from both ends in one axis direction (Y-axis direction) of the base part 21 in parallel, the configuration in which the adjustment vibrating arms 25a, 25b as second vibrating arms extended from respective ends of the pair of connecting arms 24a, 24b extended from both ends in the other axis direction (X-axis direction) of the base part 21 in parallel to the drive vibrating arms 22a, 22b sides has been explained. Note limited to that, but, when quartz crystal is used as the base material of the vibration gyro device, the second vibrating arms may be provided in parallel to the detection vibrating arms, for example, as long as they may extend in a direction intersecting the crystal X-axis (electrical axis) of the quartz crystal. For example, they may be provided in parallel to the detection vibrating arms.

Figure 10:
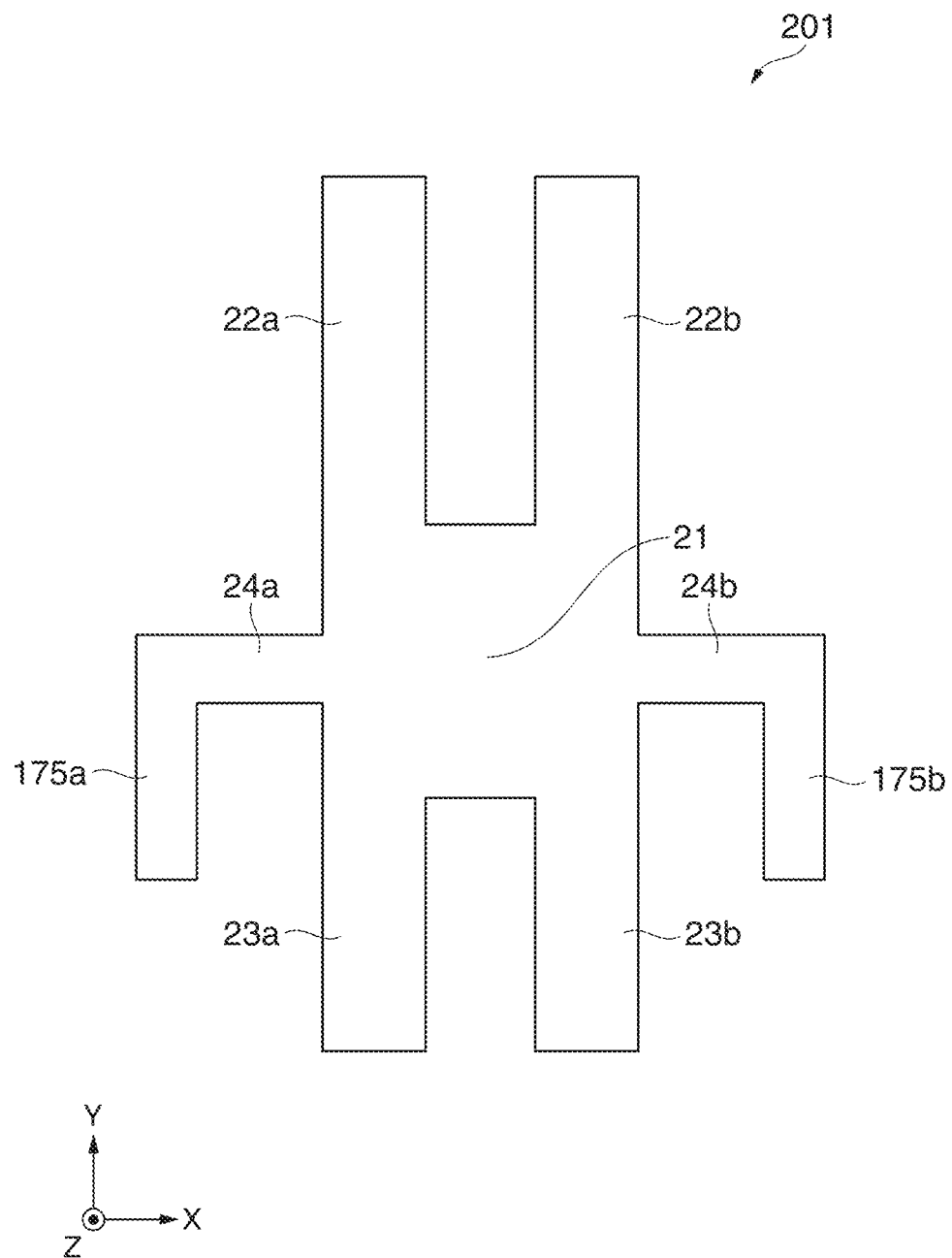
FIG. 10 is a schematic plan view showing modified example 2 of the vibration gyro device.

FIG. 10 is a schematic plan view showing modified example 2 of the vibration gyro device in which adjustment vibrating arms as second vibrating arms are provided in parallel to detection vibrating arm sides in the vibration gyro device as the H-shaped vibrator element. Note that the vibration gyro device of the modified example has the same configurations as those of the vibration gyro device 1 of the first embodiment except the configuration in the extension direction of the adjustment vibrating arms, and the same signs are assigned and their explanation will be omitted.

As shown in FIG. 10, a vibration gyro device 201 of the modified example 2 is a H-shaped vibrator element having the same configuration as that of the vibration gyro device 1 of the first embodiment, in which a base part 21 and drive vibrating arms 22a, 22b and detection vibrating arms 23a, 23b as first vibrating arms are respectively extended from both ends in one axis direction (Y-axis direction) of the base part 21 in parallel.

A pair of connecting arms 24a, 24b are respectively extended from both ends in the other axis direction (X-axis direction) of the base part 21, and a pair of adjustment vibrating arms 175a, 175b as second vibrating arms are extended from the ends of the respective connecting arms 24a, 24b in a direction in parallel to the extension direction of the detection vibrating arms 23a, 23b.

Further, though not shown, on the adjustment vibrating arms 175a, 175b, adjustment electrodes as membranes are provided like the adjustment vibrating arms 25a, 25b of the vibration gyro device 1 of the first embodiment, and electrically connected to corresponding detection electrodes (not shown) provided on the detection vibrating arms 23a, 23b.

According to the vibration gyro device 201 of the modified example 2, the adjustment vibrating arms 175a, 175b that adjust leakage output of the detection vibrating arms 23a, 23b are provided in parallel to the detection vibrating arms 23a, 23b sides not to the drive vibrating arms 22a, 22b sides. As described above, the adjustment vibrating arms 175a, 175b having the adjustment electrodes electrically connected to the detection electrodes provided on the detection vibrating arms 23a, 23b and the drive vibrating arms 22a, 22b provided with drive electrodes are not adjacently but separately placed, and thereby, deterioration of detection sensitivity that may be caused due to coupling of drive signals and detection signals may be suppressed.

Note that, in the vibration gyro device 201 of the modified example, like the vibration gyro device 11 of modified example 1, by providing spindle parts as wider parts wider than other parts on ends of the respective detection vibrating arms 23a, 23b and ends of the respective drive vibrating arms 22a, 22b, detection sensitivity of the angular velocity may be improved while the smaller size is kept.

Modified Example 3

Next, a modified example of another vibrator element than the vibration gyro device 1 of the first embodiment, the vibration gyro device 11 of modified example 1, or the vibration gyro device 201 of modified example 2 will be explained.

Figure 11:
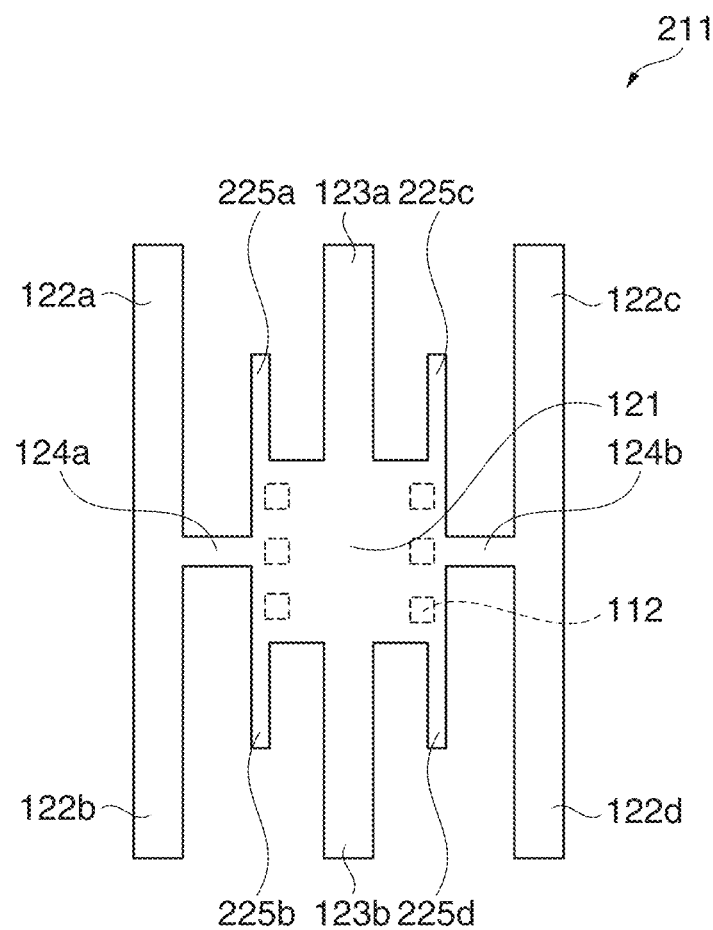
FIG. 11 is a schematic plan view for explanation of modified example 3 of the vibration gyro device.

FIG. 11 is a schematic plan view showing modified example 3 of the vibration gyro device.

As shown in FIG. 11, in a vibration gyro device 211 of the modified example, a base part 121 located in the center part, detection vibrating arms 123a, 123b as first vibrating arms extended from centers at both ends in the Y-axis direction of the base part 121 along the Y-axis, a pair of connecting arms 124a, 124b extended from the base part 121 to be orthogonal to the detection vibrating arms 123a, 123b along the X-axis, respective pairs of drive vibrating arms 122a, 122b, 122c, 122d as first vibrating arms extended from the end sides of the respective connecting arms 124a, 124b along the Y-axis in parallel to the detection vibrating arms 123a, 123b are integrally formed.

Further, adjustment vibrating arms 225a to 225d as second vibrating arms respectively extended from both ends in the Y-axis direction of the base part 121 in a direction intersecting the X-axis are provided. In the modified example, the adjustment vibrating arms 225a, 225c and the adjustment vibrating arms 225b, 225d extended from both sides with the pair of detection vibrating arm 123a and detection vibrating arm 123b extended from the centers at both ends in the Y-axis direction along the Y-axis in between along the Y-axis direction, that is, in parallel to the respective detection vibrating arm 123a and detection vibrating arm 123b are provided.

Furthermore, though not illustrated, like the vibration gyro device 1 of the first embodiment, in the vibration gyro device 211, detection electrodes are formed on the detection vibrating arms 123a, 123b, drive electrodes are formed on the drive vibrating arms 122a to 122d, and, for example, membranes such as adjustment electrodes electrically connected to corresponding detection electrodes are provided on the adjustment vibrating arms 225a to 225d.

In addition, on one principal surface (the surface at the depth side in the drawing) of the base part 121, connection electrodes 112 led out from the detection electrodes provided on the detection vibrating arms 123a, 123b and the drive electrodes provided on the drive vibrating arms 122a to 122d for external electrical connection are provided.

The vibration gyro device 211 of the modified example has a vibrator element structure that may be called "double-T-shaped" from its outer shape, and has a symmetrical shape with respect to a virtual center line in the X-axis direction and a virtual center line in the Y-axis direction. Thereby, by bonding with electrical connection to an external substrate via the connection electrodes 112 of the base part 121, the device is supported with balance and detection sensitivity may be improved. Further, the adjustment vibrating arms as the second vibrating arms are provided within the inner regions of the two pairs of drive vibrating arms 122a to 122d at both sides with the respective detection vibrating arms 123a, 123b in between, and there is an advantage that the outer size is not increased.

In the vibration gyro device, the detection arms vibrate in the X-axis direction due to slight shifts of balance between the right and left drive arms at driving or the like, and this causes leakage output and deterioration of sensitivity. To reduce the leakage output to the detection arms, the balance has been adjusted by laser processing of spindles of the drive arms in related art, however, durability of the vibrating arms might be deteriorated. On the other hand, in the vibration gyro device of the modified example 3, by providing the adjustment arms and adding the output at the opposite phase that cancels out the leakage output generated in the detection arms directly to the detection arms or on the circuits, the leakage output may be reduced. Therefore, the vibration gyro device 211 in which deterioration of sensitivity due to leakage output is suppressed may be provided.

Note that, in the vibration gyro device 211 of the modified example, like the vibration gyro device 11 of the modified example 1, by providing spindle parts as wider parts wider than other parts on ends of the respective detection vibrating arms 123a, 123b and ends of the respective drive vibrating arms 122a, 122b, detection sensitivity of the angular velocity may be improved while the smaller size is kept.

Fifth Embodiment

Electronic Apparatus

In an electronic apparatus including the vibration gyro devices 1, 11, 201, 211 as vibrator elements having the adjustment vibrating arms 25a, 25b, 125a, 125b, 175a, 175b, 225a, 225b, 225c, and 225d as the second vibrating arms explained in the embodiments and the modified examples and the gyro sensor 50 as the sensor unit having them, sensitivity can be improved because the leakage output is reduced while downsizing is realized.

Figure 12A:
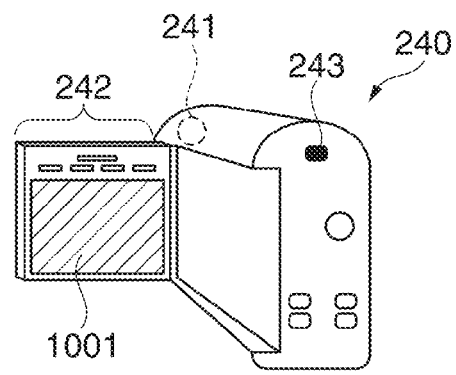
FIGS. 12A to 12C show one embodiment (fifth embodiment) of an electronic apparatus including the vibrator element (vibration gyro device) of the embodiments and modified examples or the sensor unit (gyro sensor)

For example, FIG. 12A shows an application example to a digital video camera. A digital video camera 240 includes a receiver part 241, an operation part 242, an audio input part 243, and a display unit 1001. By mounting the vibration gyro devices 1, 11, 201, 211 and the gyro sensor 50 as the sensor unit on the digital video camera 240, the so-called hand-shake compensation function may be provided.

Figure 12B:
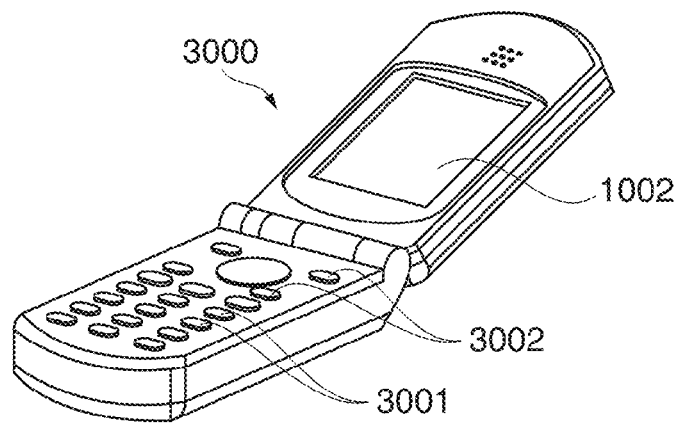
Figure 12C:
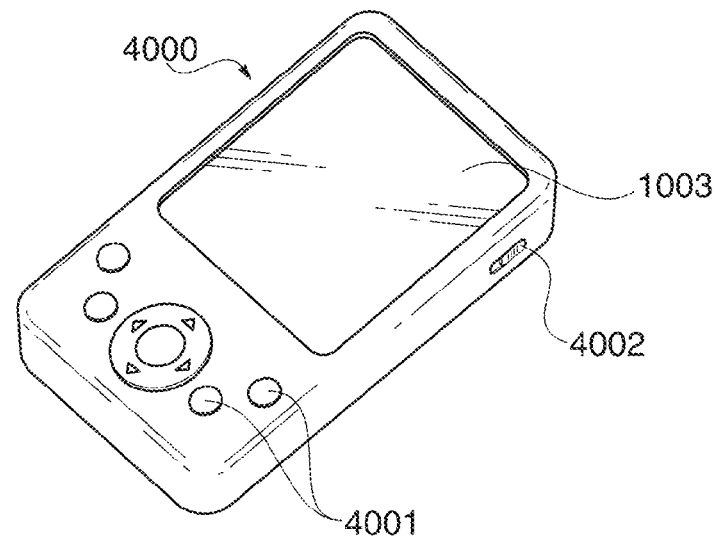

Further, FIGS. 12B and 12C show application examples to a cellular phone and a personal digital assistants (PDA) as an electronic apparatus, respectively.

First, a cellular phone 3000 shown in FIG. 12B has plural operation buttons 3001 and a scroll button 3002, and a display unit 1002. By operating the scroll button 3002, the screen displayed on the display unit 1002 is scrolled.

Further, a PDA 4000 shown in FIG. 12C has plural operation button 4001, a power switch 4002, and a display unit 1003. By operating the power switch 4002, various information including an address list and a schedule is displayed on the display unit 1003.

By mounting the vibration gyro devices 1, 11, 201, 211 and the gyro sensor 50 as the sensor unit of the embodiments on the cellular phone 3000 and the PDA 4000, various functions may be provided. For example, when a camera function (not shown) is provided to the cellular phone 3000 in FIG. 12B, the hand-shake compensation may be performed like the digital video camera 240. Further, when a global positioning system widely known as GPS is provided to the cellular phone 3000 in FIG. 12B and the PDA 4000 in FIG. 12C, by mounting the vibration gyro devices 1, 11, 201, 211 and the gyro sensor 50 as the sensor unit of the embodiments, the location and the position of the cellular phone 3000 and the PDA 4000 may be recognized in the GPS.

Note that, not limited to the electronic apparatus shown in FIGS. 12A to 12C, as an electronic apparatus to which the sensor unit (gyro sensor) having the vibrator element of the invention is applicable, a mobile computer, a car navigation system, an electronic organizer, an electric calculator, a work station, a videophone, a POS terminal, a game machine, etc. may be cited.

As above, the embodiments of the invention of the inventors have been specifically explained, however, the invention is not limited to the above described embodiments, but various changes may be made without departing from the scope thereof.

For example, in the embodiments and the modified examples, examples using quartz crystal as the formation material of the vibration gyro devices as vibrator elements have been explained, however, piezoelectric materials other than quartz crystal may be used. For example, oxide substrates of aluminum nitride (AlN), lithium niobate ($LiNbO_3$), lithium tantalate ($LiTaO_3$), lead zirconate titanate (PZT), lithium tetraborate ($Li_2B_4O_7$), langasite ($La_3Ga_5SiO_{14}$), etc., laminated piezoelectric substrates formed by laminating piezoelectric materials of aluminum nitride, tantalum pentoxide ($Ta_2O_5$), etc. on a glass substrate, or piezoelectric ceramics, or the like may be used.

Further, the vibrator element may be formed using a material other than the piezoelectric materials. For example, the vibrator element may be formed using a silicon semiconductor material or the like.

Furthermore, the vibration (drive) system of the vibrator element is not limited to piezoelectric driving. In addition to the piezoelectric drive type using the piezoelectric substrate, the configurations and the effects of the invention may be exerted even in the vibrator elements of the electrostatic drive type using electrostatic force, Lorentz drive type using magnetic force, etc.

Further, in the modified example 1, the example of widening the range of the adjustment for suppression of leakage output by providing the spindle parts 127a, 127b as wider parts at ends at the free end sides of the adjustment vibrating arms 125a, 125b as the second vibrating arms has been explained.

Not limited to that, but by providing spindle parts as wider parts at ends at the free end sides of the drive vibrating arms and detection vibrating arms as the first vibrating arms, the smaller size and higher sensitivity may be realized such that the resonance frequency may be reduced while increase in the outer size of the vibrator element (vibration gyro device) is suppressed.

What is claimed is:

1. A vibrator element comprising:
   a vibrating member; and
   an adjustment member that outputs an adjustment signal, the adjustment signal suppressing a vibration signal of leakage vibration of the vibrating member.

2. The vibrator element according to claim 1, wherein the adjustment signal is at an opposite phase to the vibration signal of the leakage vibration of the vibrating member.

3. The vibrator element according to claim 1, wherein the vibrating member includes a drive member and a detection member.

4. The vibrator element according to claim 3, wherein the adjustment member and the detection member are electrically connected to each other.

5. The vibrator element according to claim 1, wherein the vibrating member includes a drive vibrating arm and a detection vibrating arm.

6. A sensor unit comprising:
   the vibrator element according to claim 1;
   an electronic component including a drive circuit that excites the vibrating member and a detection circuit that detects a detection signal generated in the vibrating member; and
   a package that contains the vibrator element and the electronic component.

7. An electronic apparatus comprising:
   the vibrator element according to claim 1.

* * * * *